US012631960B2

(12) United States Patent
Choi

(10) Patent No.: US 12,631,960 B2
(45) Date of Patent: May 19, 2026

(54) PHOTOSENSITIVE RESIN COMPOSITION, PHOTOSENSITIVE RESIN FILM USING SAME, COLOR FILTER, AND DISPLAY DEVICE

(71) Applicant: SAMSUNG SDI CO., LTD., Yongin-si (KR)

(72) Inventor: Kyubuem Choi, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 755 days.

(21) Appl. No.: 18/007,533

(22) PCT Filed: Jul. 13, 2021

(86) PCT No.: PCT/KR2021/008925

§ 371 (c)(1),
(2) Date: Dec. 1, 2022

(87) PCT Pub. No.: WO2022/039389

PCT Pub. Date: Feb. 24, 2022

(65) Prior Publication Data

US 2023/0236500 A1 Jul. 27, 2023

(30) Foreign Application Priority Data

Aug. 19, 2020 (KR) ........................ 10-2020-0104059

(51) Int. Cl.
*G03F 7/00* (2006.01)
*G03F 7/028* (2006.01)

(52) U.S. Cl.
CPC ............ *G03F 7/0007* (2013.01); *G03F 7/028* (2013.01)

(58) Field of Classification Search
CPC .......... G03F 7/00; G03F 7/0007; G03F 7/028; G02F 1/1335
See application file for complete search history.

(56) References Cited

U.S. PATENT DOCUMENTS 5,026,905 A 6/1991 Tarnowski et al.
5,346,545 A 9/1994 Chassot
(Continued)

FOREIGN PATENT DOCUMENTS

CN 111308859 A 8/2020
JP 1994-041458 A 2/1994
(Continued)

OTHER PUBLICATIONS

English machine generated translation of KR-20180026967-A (Mar. 2018) (Year: 2018).*
(Continued)

*Primary Examiner* — Jonathan Johnson
*Assistant Examiner* — Jayson D Cosgrove
(74) *Attorney, Agent, or Firm* — Lee IP Law, P.C.

(57) ABSTRACT

Provided are: a photosensitive resin composition including a dye containing a mixture of (A-1) a compound represented by a particular chemical formula and a shell surrounding same, (A-2) a compound represented by another particular chemical formula and a shell surrounding same, and (A-3) a compound represented by still another particular chemical formula and a shell surrounding same; a photosensitive resin film prepared using the composition; a color filter including the photosensitive resin film; and a display device including the color filter.

21 Claims, 1 Drawing Sheet

(56) References Cited

U.S. PATENT DOCUMENTS

| | | | | |
|---|---|---|---|---|
| 6,033,813 | A | 3/2000 | Endo et al. | |
| 2011/0020738 | A1 * | 1/2011 | Mizukawa | G03F 7/0007 430/7 |
| 2011/0118459 | A1 | 5/2011 | Smith et al. | |
| 2019/0048196 | A1 | 2/2019 | Kobzev et al. | |
| 2019/0382587 | A1 * | 12/2019 | Seo | G03F 7/033 |

FOREIGN PATENT DOCUMENTS

| | | | | | |
|---|---|---|---|---|---|
| JP | 1995-140654 | A | | 6/1995 | |
| JP | 1998-254133 | A | | 9/1998 | |
| JP | 2793850 | B2 | | 9/1998 | |
| JP | 2015-098589 | A | | 5/2015 | |
| JP | 2016-117858 | A | | 6/2016 | |
| JP | 6498929 | B2 | | 4/2019 | |
| JP | 2019-148796 | A | | 9/2019 | |
| JP | 2019-163233 | A | | 9/2019 | |
| KR | 10-1999-0007097 | A | | 1/1999 | |
| KR | 10-2002-0015650 | A | | 2/2002 | |
| KR | 10-2005-0020653 | A | | 3/2005 | |
| KR | 10-2008-0060182 | A | | 7/2008 | |
| KR | 10-2009-0106226 | A | | 10/2009 | |
| KR | 10-2010-0080142 | A | | 7/2010 | |
| KR | 10-2014-0072682 | A | | 6/2014 | |
| KR | 10-1531616 | B1 | | 6/2015 | |
| KR | 10-2018-0019978 | A | | 2/2018 | |
| KR | 20180026967 | A | * | 3/2018 | G03F 7/004 |
| KR | 10-2020-0072212 | A | | 6/2020 | |
| WO | WO 2016/154782 | A1 | | 10/2016 | |
| WO | WO-2018034399 | A1 | * | 2/2018 | G03F 7/033 |

OTHER PUBLICATIONS

Chinese Office Action (including a search report) dated Jun. 1, 2023, of the corresponding Chinese Patent Application No. 202180040749.7.

International Search Report dated Oct. 13, 2021 for PCT/KR2021/008925.

* cited by examiner

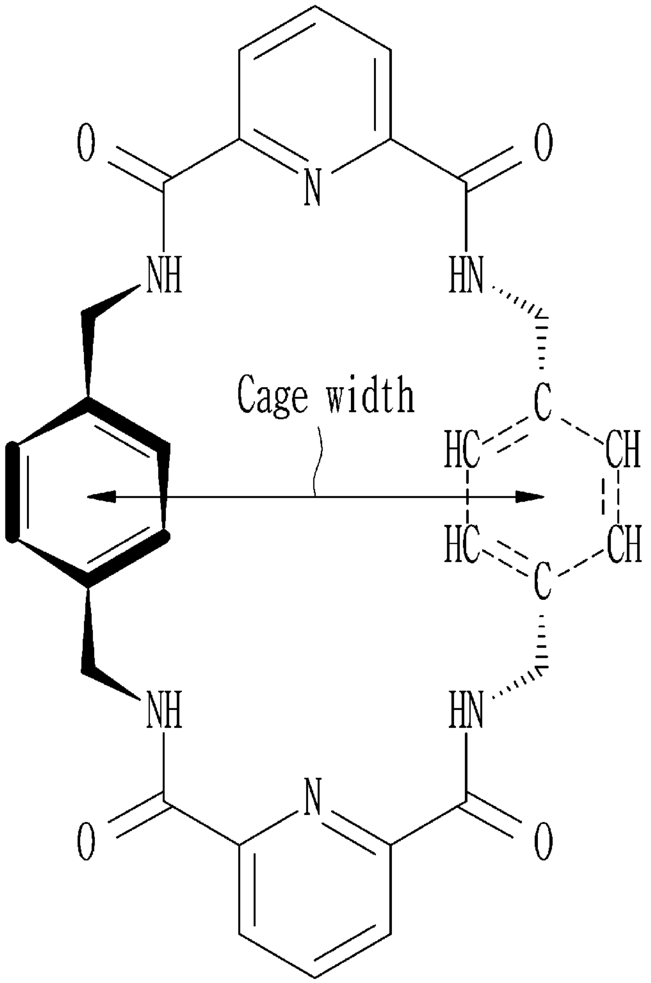
Cage width

PHOTOSENSITIVE RESIN COMPOSITION, PHOTOSENSITIVE RESIN FILM USING SAME, COLOR FILTER, AND DISPLAY DEVICE

CROSS REFERENCE TO RELATED APPLICATIONS

This is the U.S. national phase application of PCT Application No. PCT/KR2021/008925 filed on Jul. 13, 2021, and claiming priority to Korean Patent Application No. 10-2020-0104059 filed on Aug. 19, 2020, the entire contents of all of which are hereby incorporated by reference.

TECHNICAL FIELD

This disclosure relates to a photosensitive resin composition, a photosensitive resin film manufactured by using same, a color filter including the photosensitive resin film, and a display device including the color filter.

BACKGROUND ART

A liquid crystal display device among many types of displays has an advantage of lightness, thinness, low cost, low power consumption for operation, and improved adherence to an integrated circuit and has been more widely used for a laptop computer, a monitor, and a TV screen. The liquid crystal display device includes a lower substrate on which a black matrix, a color filter, and an ITO pixel electrode are formed, and an upper substrate on which an active circuit portion including a liquid crystal layer, a thin film transistor, and a capacitor layer and an ITO pixel electrode are formed. Color filters are formed in a pixel region by sequentially stacking a plurality of color filters (in general, formed of three primary colors of a plurality of colors (generally red (R), green (G), and blue (B)) in a predetermined order to form each pixel, and a black matrix layer is disposed in a predetermined pattern on a transparent substrate to form a boundary between the pixels. The pigment dispersion method that is one of methods of forming a color filter provides a colored thin film by repeating a series of processes such as coating a photopolymerizable composition including a colorant on a transparent substrate including a black matrix, exposing a formed pattern to light, removing a non-exposed part with a solvent, and thermally curing the same. A color photosensitive resin composition used for manufacturing a color filter according to the pigment dispersion method generally includes an alkali soluble resin, a photopolymerizable monomer, a photopolymerization initiator, a solvent, and other additives. The pigment dispersion method having the characteristics is actively applied to manufacture an LCD such as a mobile phone, a laptop, a monitor, and TV. However, a photosensitive resin composition for a color filter for the pigment dispersion method has recently required improved performance as well as excellent pattern characteristics. Particularly, high color reproducibility and high luminance and high contrast ratio characteristics are urgently required.

However, a color filter manufactured by using a pigment-type photosensitive resin composition has a limit in luminance and a contrast ratio due to a pigment particle size. In addition, a color image sensor device for an image sensor requires a smaller dispersion particle diameter to form a fine pattern. In order to correspond to the requirements, an attempt to realize a color filter having improved luminance and a contrast ratio has been made by introducing a dye forming no particle instead of the pigment to prepare a photosensitive resin composition appropriate for the dye.

On the other hand, an image sensor is a part for photographing images in a portable phone camera or DSC (a digital still camera). It may be classified as a charge-coupled device (CCD) image sensor and a complementary metal oxide semiconductor (CMOS) image sensor depending upon the manufacturing process and the application method. A color imaging device for a charge-coupled device image sensor or a complementary metal oxide semiconductor image sensor includes color filters each having filter segments of mixing primary color of red, green, and blue, and the colors are separated. A recent color filter mounted in the color imaging device has a pattern size of 2 μm or less, which is 1/100th to 1/200th of the pattern size of a conventional color filter pattern for LCDs. Accordingly, increased resolution and decreased pattern residues are important factors for determining the performance of a device.

Accordingly, research to utilize dyes as a colorant in the photosensitive resin composition for an image sensor is currently ongoing.

DISCLOSURE

Technical Problem

An embodiment is to provide a photosensitive resin composition capable of resolving a precipitation phenomenon due to aggregation between squarylium-based dyes in a solvent by greatly improving a solubility of the squarylium-based dye in a solvent.

Another embodiment is to provide a photosensitive resin film manufactured using the photosensitive resin composition.

Another embodiment is to provide a color filter including the photosensitive resin film.

Another embodiment is to provide a display device including the color filter.

Technical Solution

An embodiment of the present invention provides a photosensitive resin composition including a dye containing a mixture of (A-1) a compound represented by Chemical Formula 1 and a shell surrounding it, (A-2) a compound represented by Chemical Formula 2 and a shell surrounding it, and (A-3) a compound represented by Chemical Formula 3 and a shell surrounding it.

[Chemical Formula 1]

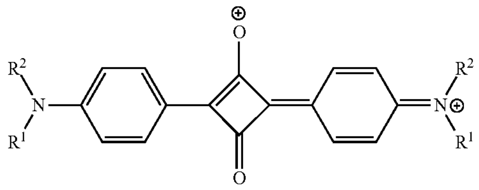

[Chemical Formula 2]

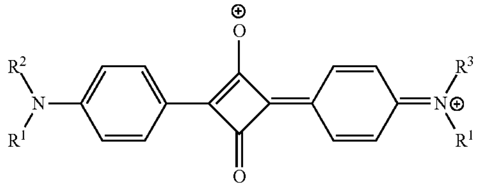

-continued

[Chemical Formula 3]

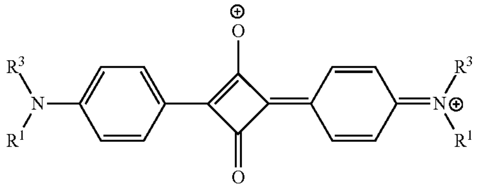

In Chemical Formula 1 to Chemical Formula 3, $R^1$ to $R^3$ are each independently a substituted or unsubstituted C1 to C20 alkyl group, a substituted or unsubstituted C3 to C20 cycloalkyl group, or a substituted or unsubstituted C6 to C20 aryl group, and $R^1$ to $R^3$ are each different from each other.

$R^1$ may be a substituted or unsubstituted C6 to C20 aryl group and $R^2$ and $R^3$ may independently be a substituted or unsubstituted C1 to C20 alkyl group or a substituted or unsubstituted C3 to C20 cycloalkyl group, provided that $R^2$ and $R^3$ may each be different from each other.

$R^1$ may be a C6 to C20 aryl group substituted with a C1 to C10 alkyl group.

$R^2$ and $R^3$ may each independently be a C1 to C20 alkyl group substituted with 'a C1 to C10 alkyl group and/or a C1 to C10 alkoxy group,' and $R^2$ and $R^3$ may each be different from each other.

In the mixture, the compound represented by Chemical Formula 1 and the compound represented by Chemical Formula 3 may each be included in the same content. In this case, the compound represented by Chemical Formula 2 may be included in an amount greater than each of the compound represented by Chemical Formula 1 and the compound represented by Chemical Formula 3.

The mixture may include the compound represented by Chemical Formula 1, the compound represented by Chemical Formula 2, and the compound represented by Chemical Formula 3 in a weight ratio of 1:2:1.

The compound represented by Chemical Formula 1 may be represented by any one of Chemical Formula 1-1 to Chemical Formula 1-3.

[Chemical Formula 1-1]

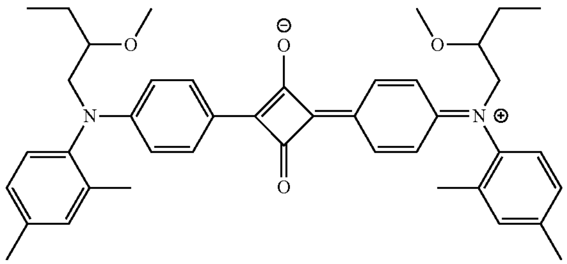

[Chemical Formula 1-2]

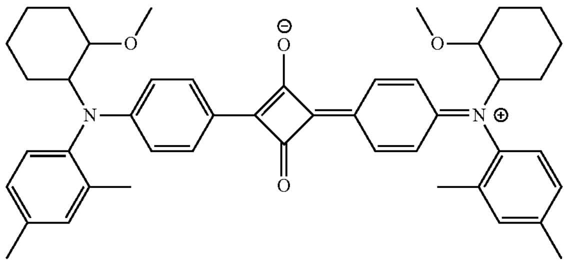

-continued

[Chemical Formula 1-3]

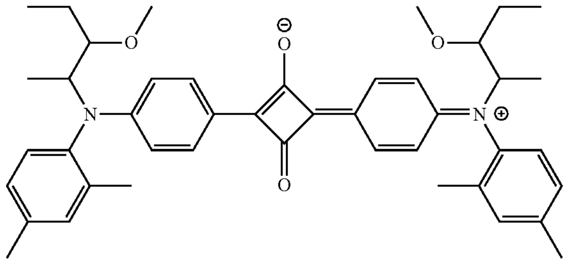

The compound represented by Chemical Formula 2 may be represented by any one of Chemical Formula 2-1 to Chemical Formula 2-7.

[Chemical Formula 2-1]

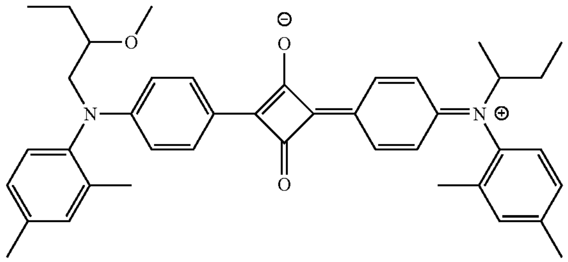

[Chemical Formula 2-2]

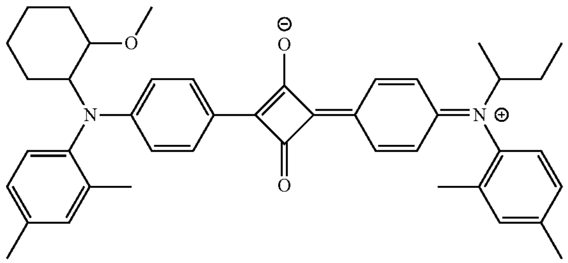

[Chemical Formula 2-3]

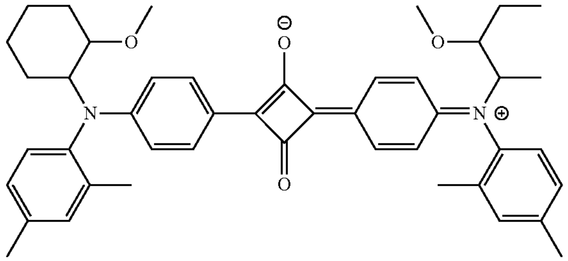

-continued
[Chemical Formula 2-4]
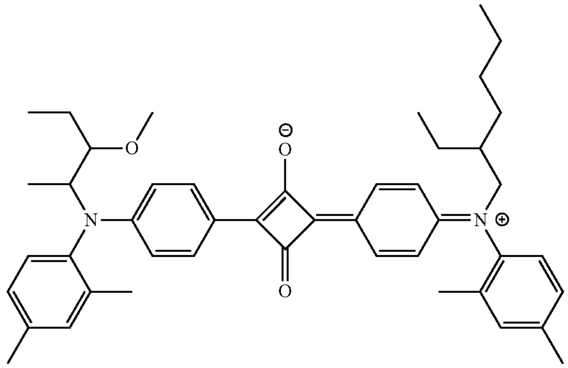
[Chemical Formula 2-5]
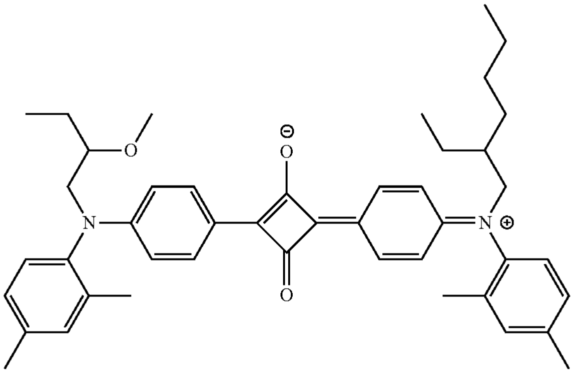
[Chemical Formula 2-6]
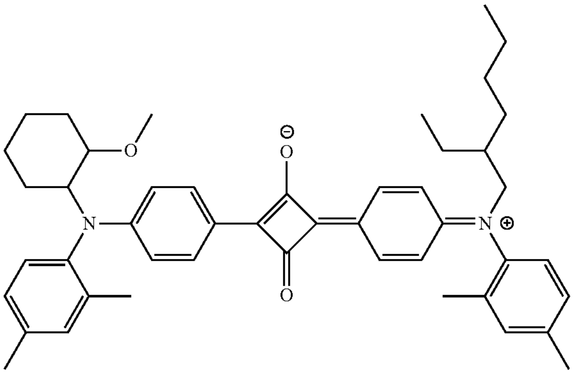
[Chemical Formula 2-7]
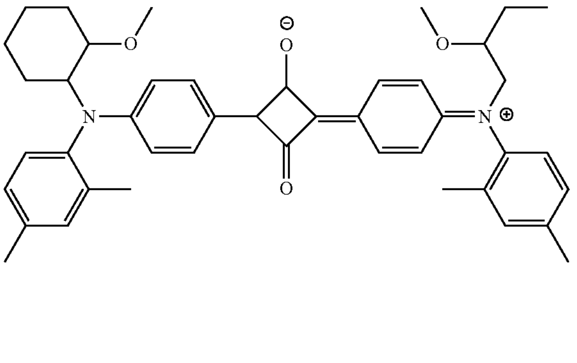
The compound represented by Chemical Formula 3 may be represented by any one of Chemical Formula 3-1 to Chemical Formula 3-4.
[Chemical Formula 3-1]
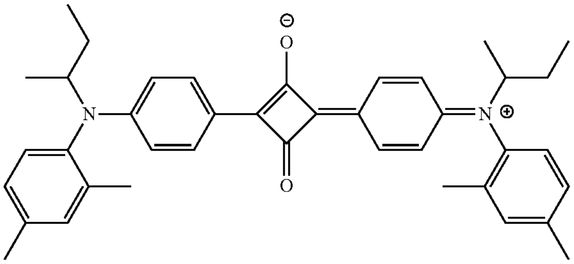
[Chemical Formula 3-2]
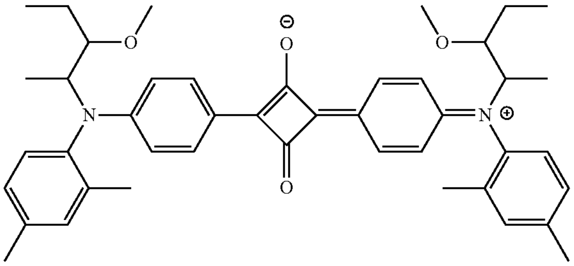
[Chemical Formula 3-3]
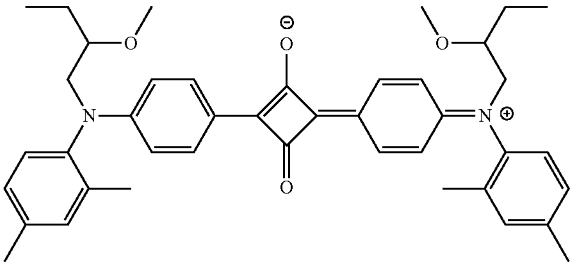
[Chemical Formula 3-4]
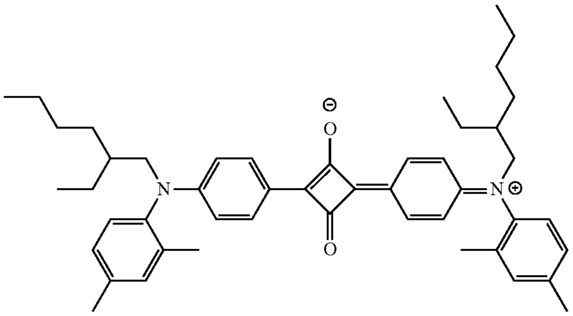
The shell may be represented by Chemical Formula 4 or Chemical Formula 5.
[Chemical Formula 4]
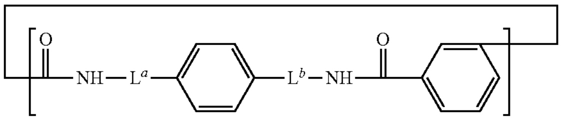

-continued

[Chemical Formula 5]

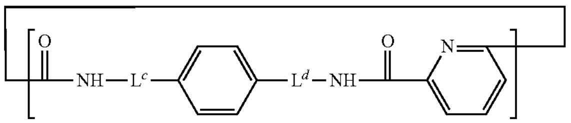

In Chemical Formula 4 and Chemical Formula 5, $L^a$ to $L^d$ are each independently a single bond or a substituted or unsubstituted C1 to C10 alkylene group.

$L^a$ to $L^d$ may each independently be a substituted or unsubstituted C1 to C10 alkylene group.

The shell may be represented by Chemical Formula 4-1 or Chemical Formula 5-1.

[Chemical Formula 4-1]

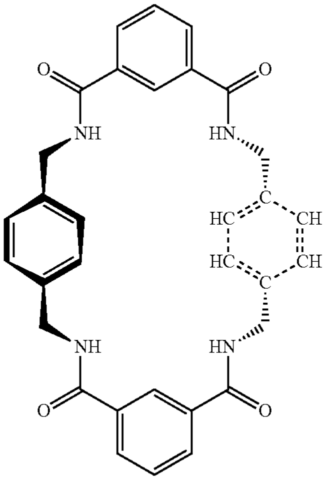

[Chemical Formula 5-1]

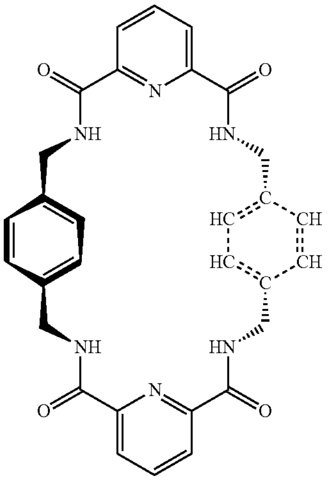

The shell may have a cage width of 6.5 Å to 7.5 Å.

The compound represented by Chemical Formula 1, the compound represented by Chemical Formula 2, and the compound represented by Chemical Formula 3 may each independently have a length of 1 nm to 3 nm.

The photosensitive resin composition may further include a binder resin, a photopolymerizable monomer, a photopolymerization initiator, and a solvent.

The photosensitive resin composition may further include an additive of malonic acid, 3-amino-1,2-propanediol, a silane-based coupling agent, a leveling agent, a fluorine-based surfactant, a radical polymerization initiator, or a combination thereof.

Another embodiment provides a photosensitive resin film manufactured using the photosensitive resin composition.

Another embodiment provides a color filter including the photosensitive resin film.

Another embodiment provides a display device including the color filter.

Other embodiments of the present invention are included in the following detailed description.

Advantageous Effects

The photosensitive resin composition according to the embodiment greatly improves the solubility of the squarylium-based dye in the solvent, thereby controlling disadvantages of the squarylium-based solvent, that is, a phenomenon in which precipitation occurs by aggregation with each other in the solvent.

DESCRIPTION OF THE DRAWINGS

The FIG. 1 is a view showing a cage width of a shell represented by Chemical Formula 5-1.

MODE FOR INVENTION

Hereinafter, embodiments of the present invention are described in detail. However, these embodiments are exemplary, the present invention is not limited thereto and the present invention is defined by the scope of claims.

In the present specification, when specific definition is not otherwise provided, "substituted" refers to replacement of at least one hydrogen of the functional group of the present invention by at least one substituent selected from a halogen atom (F, Br, Cl, or I), a hydroxy group, a nitro group, a cyano group, an amino group ($NH_2$, $NH(R^{200})$, or $N(R^{201})(R^{202})$, wherein $R^{200}$, $R^{201}$, and $R^{202}$ are the same or different and are each independently a C1 to C10 alkyl group), an amidino group, a hydrazine group, a hydrazone group, a carboxyl group, a substituted or unsubstituted alkyl group, a substituted or unsubstituted alkenyl group, a substituted or unsubstituted alkynyl group, a substituted or unsubstituted alicyclic organic group, a substituted or unsubstituted aryl group, and a substituted or unsubstituted heterocyclic group.

In the present specification, when specific definition is not otherwise provided, "alkyl group" refers to a C1 to C20 alkyl group, and specifically a C1 to C15 alkyl group, "cycloalkyl group" refers to a C3 to C20 cycloalkyl group, and specifically a C3 to C18 cycloalkyl group, "alkoxy group" refers to a C1 to C20 alkoxy group, and specifically a C1 to C18 alkoxy group, "aryl group" refers to a C6 to C20 aryl group, and specifically a C6 to C18 aryl group, "alkenyl group" refers to a C2 to C20 alkenyl group, and specifically a C2 to C18 alkenyl group, "alkylene group" refers to a C1 to C20 alkylene group, and specifically C1 to C18 alkylene group, and "arylene group" refers to a C6 to C20 arylene group, and specifically a C6 to C16 arylene group.

In the present specification, when specific definition is not otherwise provided, "(meth)acrylate" refers to both "acrylate" and "methacrylate," and "(meth)acrylic acid" refers to "acrylic acid" and "methacrylic acid."

In the present specification, when specific definition is not otherwise provided, the term "combination" refers to mixing or copolymerization. Also, "copolymerization" refers to block copolymerization or random copolymerization, and "copolymer" refers to a block copolymer or a random copolymer.

In the Chemical Formulas of the present specification, when a definition is not otherwise provided, hydrogen is bonded at the position when a chemical bond is not drawn where supposed to be given.

In the present specification, when specific definition is not otherwise provided, "*" indicates a point where the same or different atom or Chemical Formula is linked.

In addition, in the present specification, when any member is disposed "on" another member in the present specification, the member may not only contact the other member, but still another member may also be present between these two members.

In addition, in the present specification, unless explicitly described to the contrary, the word "comprise," and variations such as "comprises" or "comprising", will be understood to imply the inclusion of stated elements but not the exclusion of any other elements.

An embodiment provides a photosensitive resin composition including a dye containing a mixture of (A-1) a compound represented by Chemical Formula 1 and a shell surrounding it, (A-2) a compound represented by Chemical Formula 2 and a shell surrounding it, and (A-3) a compound represented by Chemical Formula 3 and a shell surrounding it.

[Chemical Formula 1]

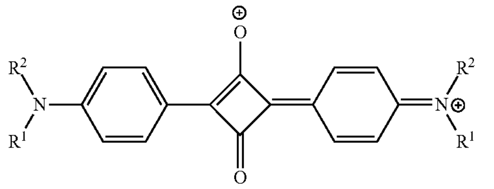

-continued

[Chemical Formula 2]

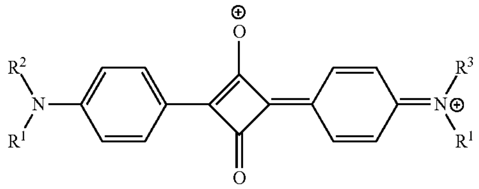

[Chemical Formula 3]

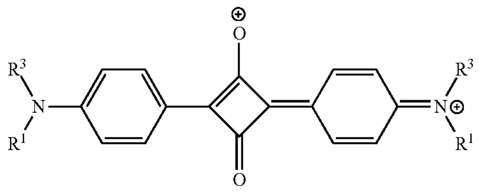

In Chemical Formula 1 to Chemical Formula 3, $R^1$ to $R^3$ are each independently a substituted or unsubstituted C1 to C20 alkyl group, a substituted or unsubstituted C3 to C20 cycloalkyl group, or a substituted or unsubstituted C6 to C20 aryl group, and $R^1$ to $R^3$ are each different from each other.

As shown in the following scheme, the compound represented by Chemical Formula 1 has three resonance structures, but in the present specification, only one resonance structure is shown for the compound represented by Chemical Formula 1 for convenience. That is, the compound represented by Chemical Formula 1 may be represented by any one of the three resonance structures, which is the same for the compound represented by Chemical Formula 2 and the compound represented by Chemical Formula 3.

[Scheme]

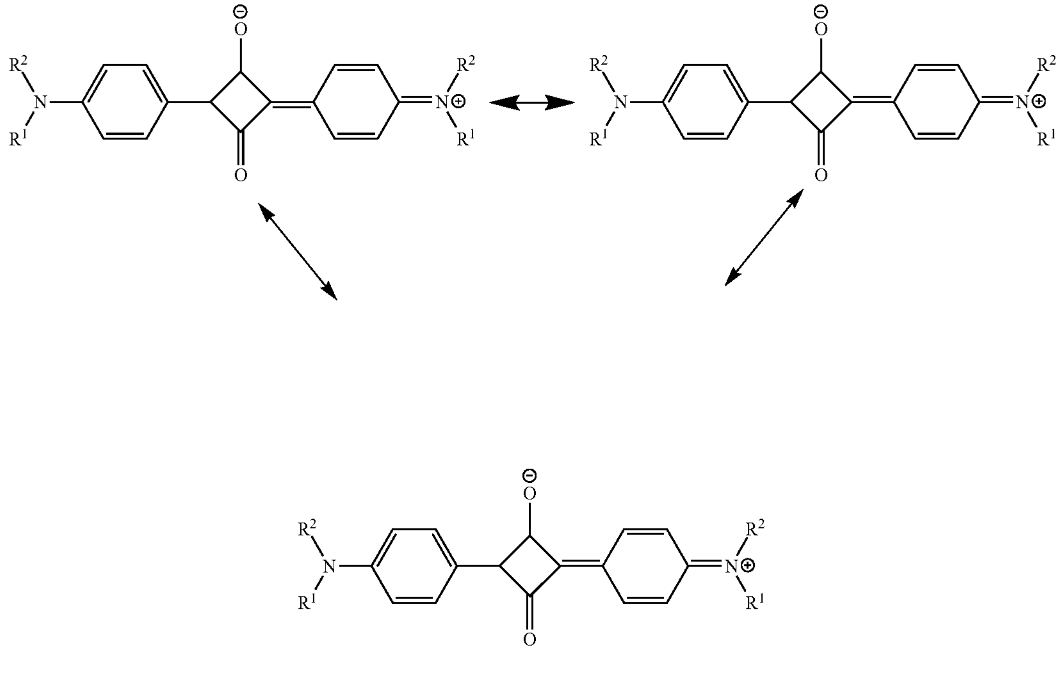

In general, a squarylium-based dye has a high molar extinction coefficient and excellent transmittance and thus may exhibit an excellent luminance and contrast ratio as a color filter material (dye). However, since solvents used in a color resist composition are limited, the squarylium-based dye has a problem of having much deteriorated solubility in usable solvents, compared with the other dyes. In other words, the squarylium-based dye, despite providing excellent luminance and contrast ratio, is greatly limited by a precipitation phenomenon due to aggregation between the squarylium-based dyes in the usable solvents. The present inventors have clearly recognized the aforementioned problem in using the squarylium-based dye and controlled a structure of the squarylium-based dye and a composition of the mixture, overcoming low solubility of the conventional squarylium-based dye.

Specifically, the squarylium-based dye is known to have excellent green spectral properties and a high molar extinction coefficient and thus excellent luminance and contrast ratio, compared with a pigment-based photosensitive resin composition, and in general, lower durability than that of a pigment has been overcome by introducing a shell such as a rotaxane structure. In other words, the squarylium-based dye may form a core-shell structure with the rotaxane shell and the like, and the dye of this core-shell structure may be used as a colorant, preparing a green photosensitive resin composition for a color filter. However, as aforementioned, the squarylium-based dye has excellent spectral properties but a problem of solubility deterioration due to the aggregation phenomenon. The present inventors have solved this problem by synthesizing mixture structures between squarylium-based dyes. Among these mixtures, since a squarylium-based dye with an asymmetric structure is not easily synthesized, the photosensitive resin composition according to an embodiment was difficult to prepare in the beginning, but through a mixing reaction of squarylium-based dye precursors, this squarylium-based dye with an asymmetric structure is easily synthesized, thereby easily preparing the photosensitive resin composition according to an embodiment.

For example, $R^1$ may be a substituted or unsubstituted C6 to C20 aryl group and $R^2$ and $R^3$ may each independently be a substituted or unsubstituted C1 to C20 alkyl group or a substituted or unsubstituted C3 to C20 cycloalkyl group. However, even in this case, $R^2$ and $R^3$ should be different from each other.

For example, $R^1$ may be a C6 to C20 aryl group substituted with a C1 to C10 alkyl group.

For example, the $R^2$ and $R^3$ are each independently a C1 to C20 alkyl group substituted with 'a C1 to C10 alkyl group and/or a C1 to C10 alkoxy group.'

However, even in this case, $R^2$ and $R^3$ should be different from each other.

When the compounds represented by Chemical Formula 1 to Chemical Formula 3 have the structure as described above, and a mixture of the compound represented by Chemical Formula 1, the compound represented by Chemical Formula 2, and the compound represented by Chemical Formula 3 is used as a dye, aggregation between the dyes may be controlled and precipitation phenomenon may be minimized, thereby largely utilizing excellent spectral characteristics of the squarylium-based dye.

Meanwhile, in order to control aggregation between squarylium-based dyes, in addition to limiting the structure of each of the squarylium-based dyes, it may also be helpful to limit the content of each of the squarylium-based dyes.

For example, in the mixture, the compound represented by Chemical Formula 1 and the compound represented by Chemical Formula 3 may each be included in the same amount.

For example, in the mixture, the compound represented by Chemical Formula 2 may be included in a greater amount than the compound represented by Chemical Formula 1.

For example, in the mixture, the compound represented by Chemical Formula 2 may be included in an amount greater than that of the compound represented by Chemical Formula 3.

For example, the mixture may include the compound represented by Chemical Formula 1, the compound represented by Chemical Formula 2, and the compound represented by Chemical Formula 3 in a weight ratio of 1:2:1.

The mixture used as a dye in the photosensitive resin composition according to an embodiment is difficult to be synthesized because it contains a squarylium-based dye having an asymmetric structure like the compound represented by Chemical Formula 1-2, but when the contents between the compounds represented by Chemical Formula 1 to Chemical Formula 3 the compounds to be controlled as described above, the synthesis of squarylium-based dyes having an asymmetric structure is facilitated through the mixing reaction of squarylium-based dye precursors, thus overcoming the disadvantage of squarylium-based dyes, low solubility in solvents, and maximizing excellent spectroscopic characteristics, which is an advantage of squarylium-based dyes.

For example, the compound represented by Chemical Formula 1 may be represented by any one of Chemical Formula 1-1 to Chemical Formula 1-3, but is not necessarily limited thereto.

[Chemical Formula 1-1]

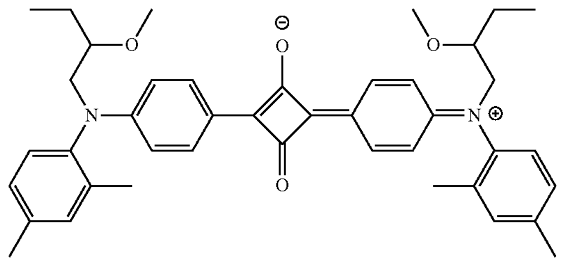

[Chemical Formula 1-2]

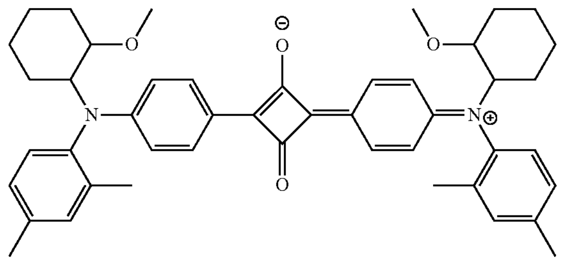

-continued

[Chemical Formula 1-3]

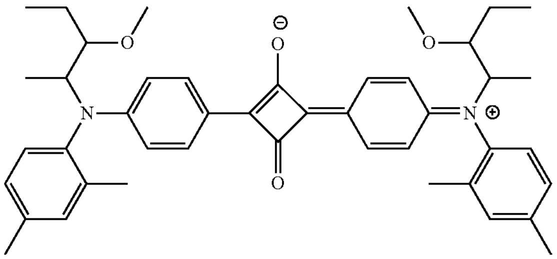

For example, the compound represented by Chemical Formula 2 may be represented by any one of Chemical Formula 2-1 to Chemical Formula 2-7, but is not limited thereto.

[Chemical Formula 2-1]

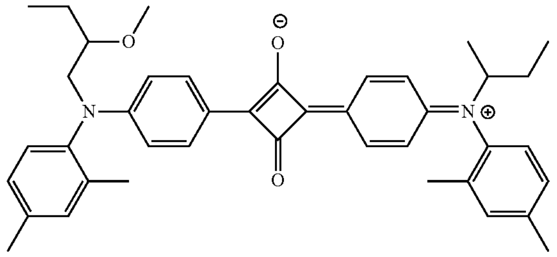

[Chemical Formula 2-2]

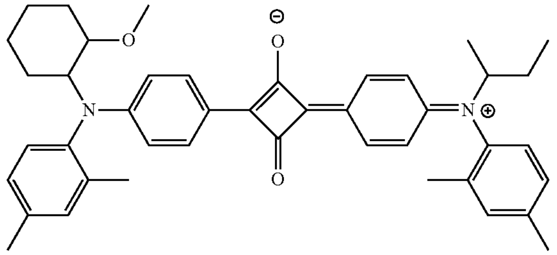

[Chemical Formula 2-3]

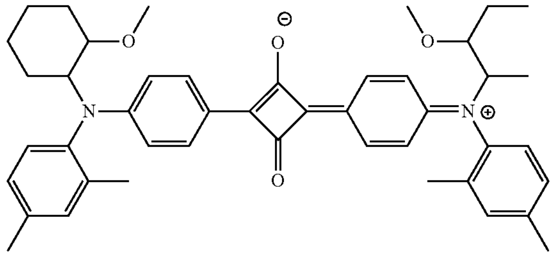

-continued

[Chemical Formula 2-4]

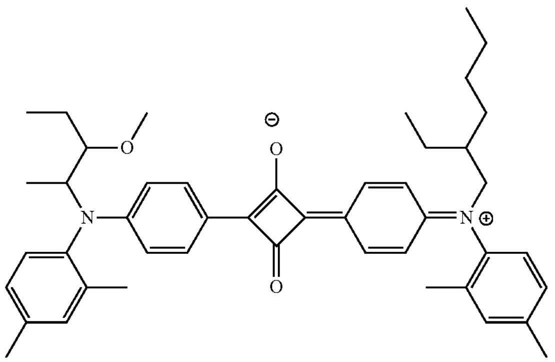

[Chemical Formula 2-5]

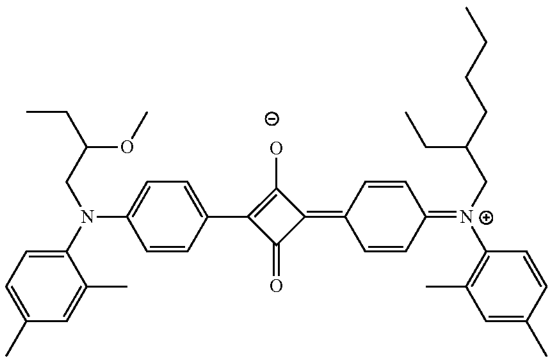

[Chemical Formula 2-6]

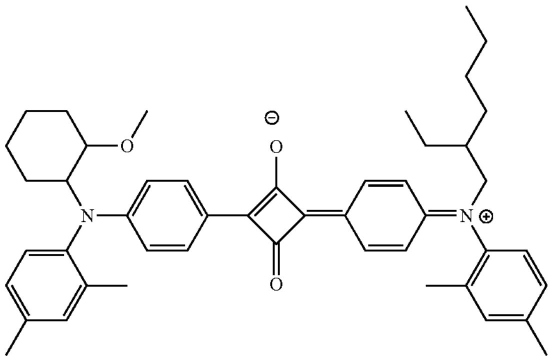

[Chemical Formula 2-7]

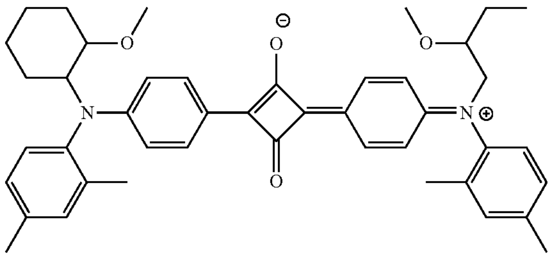

For example, the compound represented by Chemical Formula 3 may be represented by any one of Chemical Formula 3-1 to Chemical Formula 3-4, but is not limited thereto.

[Chemical Formula 3-1]

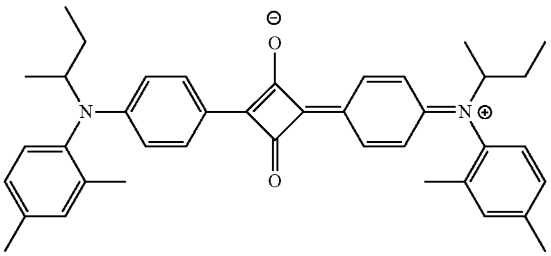

[Chemical Formula 3-2]

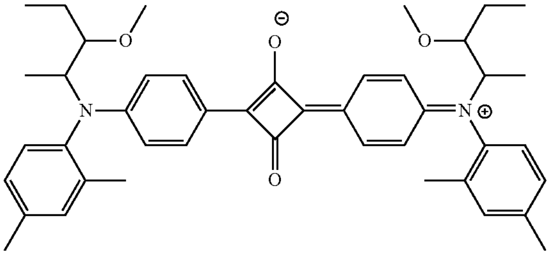

[Chemical Formula 3-3]

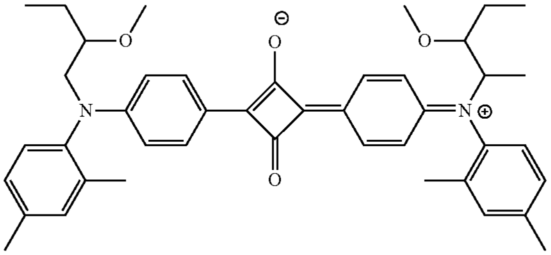

[Chemical Formula 3-4]

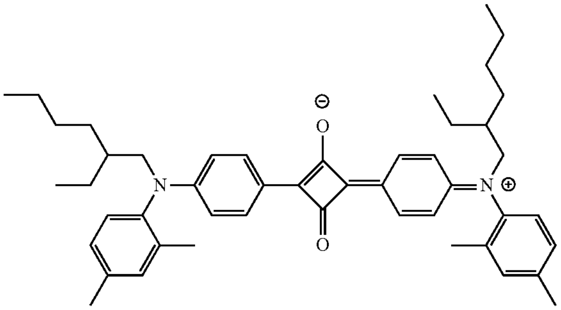

On the other hand, each of the compounds represented by Chemical Formula 1 to Chemical Formula 3 is a core constituting the dye having a core-shell structure. That is, the dye includes a mixture of a core represented by Chemical Formula 1 and a shell surrounding the core, a core represented by Chemical Formula 2 and a shell surrounding the core, and a core represented by Chemical Formula 3 and a shell surrounding the core. For example, the shell may be a macrocyclic compound, and the shell may form a coating layer while surrounding each of the compounds represented by Chemical Formula 1 to Chemical Formula 3.

In an embodiment, due to the structure in which the shell corresponding to the macrocyclic compound surrounds each of the compounds represented by Chemical Formula 1 to Chemical Formula 3, that is, a structure in which the compounds represented by Chemical Formula 1 to Chemical Formula 3 inside the macrocyclic ring, durability of the core-shell dye may be improved.

Each of the compounds represented by Chemical Formula 1 to Chemical Formula 3 included in the core or constituting the core may have a length of 1 nm to 3 nm, for example, 1.5 nm to 2 nm. When each of the compounds represented by Chemical Formula 1 to Chemical Formula 3 has a length within the above range, a core-shell dye having a structure of a core and a shell surrounding the core-shell dye may be easily formed. In other words, as each of the compounds represented by Chemical Formula 1 to Chemical Formula 3 has a length within the above range, the shell that is the macrocyclic compound, will be obtained in a structure surrounding each of the compounds represented by Chemical Formula 1 to Chemical Formula 3. When other compounds that do not fall within the above range are used, it is difficult to expect improvement in durability because it is difficult to form a structure in which the shell surrounds the core compound.

For example, the shell may be represented by Chemical Formula 4 or Chemical Formula 5.

[Chemical Formula 4]

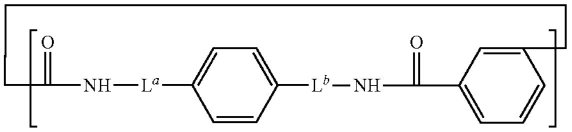

[Chemical Formula 5]

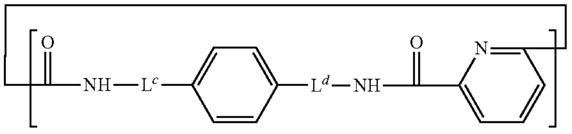

In Chemical Formula 4 and Chemical Formula 5, $L^a$ to $L^d$ are each independently a single bond or a substituted or unsubstituted C1 to C10 alkylene group.

In Chemical Formula 4 or Chemical Formula 5, $L^a$ to $L^d$ may each independently be a substituted or unsubstituted C1 to C10 alkylene group. In this case, the solubility is improved and it is easy to form a structure in which the shell surrounds the core including each of the compounds represented by Chemical Formula 1 to Chemical Formula 3.

For example, the core-shell dye according to an embodiment may include a non-covalent bond, that is a hydrogen bond between an oxygen atom of each of the compounds represented by Chemical Formula 1 to Chemical Formula 3 and a hydrogen atom of a nitrogen atom of the shell represented by Chemical Formula 4 or Chemical Formula 5.

The shell may be, for example, represented by Chemical Formula 4-1 or Chemical Formula 5-1.

[Chemical Formula 4-1]

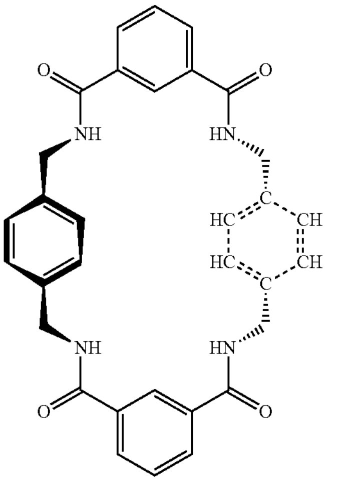

[Chemical Formula 5-1]

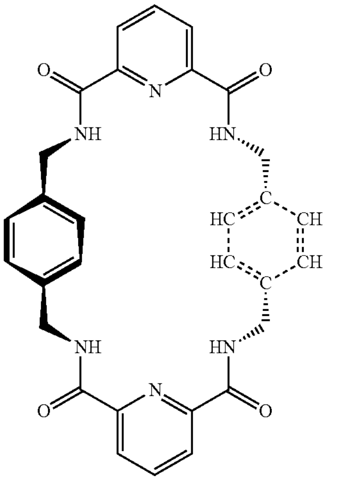

The cage width of the shell may be 6.5 Å to 7.5 Å and the volume of the shell may be 10 Å to 16 Å. The cage width in this disclosure refers to an internal distance of the shell, for example, in a shell represented by Chemical Formula 4-1 or Chemical Formula 5-1, a distance between two different phenylene groups in which both methylene groups are linked (See the FIGURE). When the shell has a cage width within the range, a core-shell dye with a structure that the shell surrounds a core including each of the compounds represented by Chemical Formula 1 to Chemical Formula 3 may be obtained, and when the mixture of the core-shell dyes is used as a coloring material in the photosensitive resin composition, durability and luminance improvement effects may be expected without precipitation.

The core-shell dye may include the core and the shell in a mole ratio of 1:1. When the core and the shell are present in the mole ratio, a coating layer (shell) surrounding the core including each of the compounds represented by Chemical Formula 1 to Chemical Formula 3 may be well formed.

Meanwhile, the photosensitive resin composition according to an exemplary embodiment may further include a pigment as a colorant in addition to the dye.

For example, the pigment may be a red pigment, a green pigment, a blue pigment, a yellow pigment, etc., but is not necessarily limited thereto.

The red pigment may be C.I. red pigment 179, C.I. red pigment 254, C.I. red pigment 255, C.I. red pigment 264, C.I. red pigment 270, C.I. red pigment 272, C.I. red pigment 177, C.I. red pigment 89, and the like in a color index, may be used alone or as a mixture of two or more, but is not necessarily limited thereto.

The green pigment may be a halogen-substituted copper phthalocyanine pigment such as C.I. green pigment 59, C.I. green pigment 58, C.I. green pigment 36, C.I. green pigment 7, and the like, and may be used alone or as a mixture of two or more, but is not necessarily limited thereto.

The blue pigment may be C.I. blue pigment 15:6, C.I. blue pigment 15:0, C.I. blue pigment 15:1, C.I. blue pigment 15:2, C.I. blue pigment 15:3, C.I. blue pigment 15:4, C.I. blue pigment 15:5, C.I. blue pigment 15:6, C.I. blue pigment 16 in a color index, and may be used alone or as a mixture of two or more, but is not necessarily limited thereto.

The yellow pigment may be an isoindoline-based pigment such as C.I. yellow pigment 139, a quinophthalone-based pigment such as C.I. yellow pigment 138, a nickel complex pigment such as C.I. yellow pigment 150, C.I. yellow pigment 100, and the like in a color index, and may be used alone or as a mixture of two or more, but is not necessarily limited thereto.

When the colorant is a pigment, a dispersant may be used therewith to disperse the pigment. Specifically, the pigment may be pretreated with the dispersant on the surface or added therewith to prepare the composition.

The dispersant may be a non-ionic dispersant, an anionic dispersant, a cationic dispersant, and the like. Specific examples of the dispersant include polyalkylene glycol and an ester thereof, polyoxyalkylene, a polyhydric alcohol ester alkylene oxide adduct, an alcohol alkylene oxide adduct, a sulfonate ester, a sulfonate, a carboxylate ester, a carboxylate, alkyl amide alkylene oxide adduct, alkyl amine, and the like, and these may be used alone or in combination of two or more.

For example, the commercially available products of the dispersant are DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like of BYK Co., Ltd.; EFKA-47, EFKA-47EA, EFKA-48, EFKA-49, EFKA-100, EFKA-400, EFKA-450, and the like of EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like of Zeneka Co.; or PB711, PB821, and the like of Ajinomoto Inc.

The dispersant may be included in an amount of 0.1 wt % to 15 wt % based on the total amount of photosensitive resin composition. When the dispersant is included within the range, the composition has excellent stability, developability, and pattern-forming capability due to improved dispersion properties during manufacture of a black column spacer.

The pigment may be used after pre-treatment using a water-soluble inorganic salt and a wetting agent. When the pigment is used after the pre-treatment, an average particle diameter of the pigment may become finer.

The pre-treatment may be performed by kneading the pigment with a water-soluble inorganic salt and a wetting agent and then, filtering and washing the kneaded pigment.

The kneading may be performed at a temperature ranging from 40° C. to 100° C., and the filtering and washing may be performed by filtering the pigment after washing away an inorganic salt with water and the like.

Examples of the water-soluble inorganic salt may be sodium chloride, potassium chloride, and the like, but are not limited thereto. The wetting agent may make the pigment to be uniformly mixed with the water-soluble inorganic salt uniformly and be pulverized. Examples of the wetting agent may include alkylene glycol monoalkylether such as ethylene glycol monoethylether, propylene glycol monomethylether, or diethylene glycol monomethylether; an alcohol such as ethanol, isopropanol, butanol, hexanol, cyclohexanol, ethylene glycol, diethylene glycol, polyethylene glycol, glycerine polyethylene glycol and these may be used alone or in combination of two or more.

The pigment after the kneading may have an average particle diameter ranging from 5 nm to 200 nm, for example, 5 nm to 150 nm. When the pigment has an average particle diameter within the range, stability of pigment dispersion may be improved and pixel resolution may not be deteriorated.

Specifically, the pigment may be used in a form of pigment dispersion including the dispersant and a solvent which will be described later, and the pigment dispersion may include a solid pigment, a dispersant, and a solvent. The solid pigment may be included in an amount of 5 wt % to 20 wt %, for example, 8 wt % to 15 wt % based on the total amount of the pigment dispersion.

The colorant ('dye' or 'dye and pigment') may be included in an amount of 20 wt % to 50 wt %, for example, 30 wt % to 40 wt %, based on the total amount of the photosensitive resin composition. When the colorant is included within the above range, the coloring effect and developing performance are improved.

The photosensitive resin composition according to an embodiment may further include a binder resin, for example, an acryl-based binder resin.

The acryl-based resin is a copolymer of a first ethylenically unsaturated monomer and a second ethylenically unsaturated monomer copolymerizable therewith, and is resin including at least one acryl-based repeating unit.

The first ethylenically unsaturated monomer may be an ethylenically unsaturated monomer including one or more carboxyl groups, and specific examples thereof may include acrylic acid, methacrylic acid, maleic acid, itaconic acid, fumaric acid, or a combination thereof.

The first ethylenically unsaturated monomer may be included in an amount of 5 wt % to 50 wt %, for example, 10 wt % to 40 wt %, based on the total amount of the acryl-based binder resin.

The second ethylenically unsaturated monomer may include aromatic vinyl compounds such as styrene, α-methylstyrene, vinyltoluene, and vinylbenzylmethylether; unsaturated carboxylate ester compounds such as methyl (meth)acrylate, ethyl (meth)acrylate, butyl (meth)acrylate, 2-hydroxyethyl (meth)acrylate, 2-hydroxy butyl (meth)acrylate, benzyl (meth)acrylate, cyclohexyl (meth)acrylate and phenyl (meth)acrylate; unsaturated carboxylic acid amino alkyl ester compounds such as 2-aminoethyl (meth)acrylate and 2-dimethylaminoethyl (meth)acrylate; carboxylic acid vinyl ester compounds such as vinyl acetate and vinyl benzoate; unsaturated carboxylic acid glycidyl ester compounds such as glycidyl (meth)acrylate; vinyl cyanide compounds such as (meth)acrylonitrile; unsaturated amide compounds such as (meth)acrylamide; and the like, and these may be used alone or in combination of two or more.

Specific examples of the acryl-based binder resin may be a (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and the like, but the present invention is not limited thereto and these may be used alone or as a mixture of two or more.

A weight average molecular weight of the acryl-based binder resin may be 3,000 g/mol to 150,000 g/mol, for example, 5,000 g/mol to 50,000 g/mol, for example, 20,000 g/mol to 30,000 g/mol. When the weight average molecular weight of the acryl-based binder resin is within the above range, the photosensitive resin composition has improved physical and chemical properties, has an appropriate viscosity, and has excellent close-contacting properties to a substrate when manufacturing a color filter.

An acid value of the acryl-based binder resin may be 15 mgKOH/g to 60 mgKOH/g, for example, 20 mgKOH/g to 50 mgKOH/g. When the acid value of the acryl-based binder resin is within the above range, the resolution of the pixel pattern is improved.

The acryl-based binder resin may be included in an amount of 1 wt % to 10 wt %, for example, 1 wt % to 5 wt % based on the total amount of the photosensitive resin composition. When the acryl-based binder resin is included within the above range, excellent sensitivity, developability, resolution, and linearity of the pattern may be obtained.

The photosensitive resin composition according to an embodiment may further include a photopolymerizable monomer.

The photopolymerizable monomer may be mono-functional or multi-functional ester of (meth)acrylic acid including at least one ethylenic unsaturated double bond.

The photopolymerizable monomer has the ethylenic unsaturated double bond and thus, may cause sufficient polymerization during exposure in a pattern-forming process and form a pattern having excellent heat resistance, light resistance, and chemical resistance.

The photopolymerizable monomer may be, for example, ethylene glycoldi(meth)acrylate, diethylene glycoldi(meth)acrylate, triethylene glycoldi(meth)acrylate, propylene glycoldi(meth)acrylate, neopentylglycoldi(meth)acrylate, 1,4-butanedioldi(meth)acrylate, 1,6-hexanedioldi(meth)acrylate, bisphenol A di(meth)acrylate, pentaerythritoldi(meth)acrylate, pentaerythritoltri(meth)acrylate, pentaerythritoltetra(meth)acrylate, pentaerythritolhexa(meth)acrylate, dipentaerythritoldi(meth)acrylate, dipentaerythritoltri(meth)acrylate, dipentaerythritolpenta(meth)acrylate, dipentaerythritolhexa(meth)acrylate, bisphenol A epoxy(meth)acrylate, ethylene glycolmonomethylether (meth)acrylate, trimethylolpropanetri(meth)acrylate, tris(meth)acryloyloxyethyl phosphate, novolac epoxy (meth)acrylate, or a combination thereof.

Commercially available examples of the photopolymerizable monomer are as follows. The mono-functional (meth)acrylic acid ester may include Aronix M-101®, M-111 ®, M-114® (Toagosei Chemistry Industry Co., Ltd.); KAYARAD TC-110S®, TC-120S® (Nippon Kayaku Co., Ltd.); V-158®, V-2311° (Osaka Organic Chemical Ind., Ltd.), and the like. Examples of a difunctional (meth)acrylic acid ester may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth)acrylic acid ester may include Aronix M-309®, M-400®, M-405®, M-450®, M-710®, M-8030®, M-8060®, and the like of Toagosei Chemistry Industry Co., Ltd.; KAYARAD TMPTA®, DPCA-20®, DPCA-30®, DPCA-60®, DPCA-120® of Nippon Kayaku Co., Ltd., V-295®, V-300®, V-360®, V-GPT®, V-3PA®, V-400® of Osaka Yuki Kayaku Kogyo Co. Ltd., and the like. These may be used alone or as a mixture of two or more.

The photopolymerizable monomer may be treated with acid anhydride to improve developability.

The photopolymerizable monomer may be included in an amount of 1 wt % to 20 wt %, for example, 1 wt % to 10 wt % based on the total amount of the photosensitive resin composition. When the photopolymerizable monomer is included within the above range, curing occurs sufficiently during exposure in the pattern forming process, so that the reliability is improved, the heat resistance, light resistance and chemical resistance of the pattern are improved, and resolution and close-contacting properties are also improved.

The photosensitive resin composition according to an embodiment may further include a photopolymerization initiator.

The photopolymerization initiator may further include a conventionally used compound, such as a benzophenone-based compound, a thioxanthone-based compound, a benzoin-based compound, a triazine-based compound, an oxime-based compound, an acetophenone-based compound, or a combination thereof.

Examples of the benzophenone-based compound may be benzophenone, benzoylbenzoic acid, benzoylbenzoic acid-methyl, 4-phenylbenzophenone, hydroxybenzophenone, acrylatedbenzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compound may be thioxanthone, 2-methylthioxanthone, isopropylthioxanthone, 2,4-diethylthioxanthone, 2,4-diisopropylthioxanthone, 2-chlorothioxanthone, and the like.

Examples of the benzoin-based compound may be benzoin, benzoinmethylether, benzoinethylether, benzoinisopropylether, benzoinisobutylether, benzyldimethylketal, and the like.

Examples of the triazine-based compound may be 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2 bis(trichloromethyl)-6-piperonyl-s-triazine, 2-4-bis(trichloromethyl)-6-(4-methoxystyryl)-s-triazine, 2-[4-(4-ethylphenyl)-phenyl]-4,6-bis(trichloromethyl)-1,3,5-triazine, and the like.

Examples of the oxime-based compound may be O-acyloxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, 0-ethoxycarbonyl-α-oxyamino-1-phenylpropan-1-one, and the like. Specific examples of the O-acyloxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, 1-(4-phenylsulfanyl phenyl)-butan-1-oneoxime-O-acetate, and the like.

Examples of the acetophenone-based compound may include 2,2'-diethoxyacetophenone, 2,2'-dibutoxyacetophenone, 2-hydroxy-2-methylpropinophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholino)phenyl)-butan-1-one, and the like.

As the photopolymerization initiator, a carbazole-based compound, a diketone-based compound, a sulfonium borate-based compound, a diazo-based compound, an imidazole-based compound, a biimidazole-based compound, or a fluorene-based compound may be used in addition to the aforementioned compounds.

The photopolymerization initiator may be used with a photosensitizer capable of causing a chemical reaction by absorbing light and becoming excited and then, transferring its energy.

Examples of the photosensitizer may be tetraethylene glycolbis-3-mercaptopropionate, pentaerythritoltetrakis-3-mercaptopropionate, dipentaerythritoltetrakis-3-mercaptopropionate, and the like.

The photopolymerization initiator may be included in an amount of 0.1 wt % to 5 wt %, for example, 0.1 wt % to 3 wt % based on the total amount of the photosensitive resin composition. When the photopolymerization initiator is included within the ranges, sufficient curing occurs during exposure in a pattern-forming process, excellent reliability may be realized, heat resistance, light resistance, and chemical resistance of patterns, resolution, and close-contacting properties may be improved, and decrease of transmittance due to a non-reaction initiator may be prevented.

The photosensitive resin composition according to an embodiment may further include a solvent.

The solvent is a material having compatibility with the colorant, the photopolymerization initiator, the photopolymerizable monomer, and the acryl-based binder resin, but not reacting therewith.

Examples of the solvent may include alcohols such as methanol, ethanol, and the like; ethers such as dichloroethyl ether, n-butyl ether, diisoamyl ether, methylphenyl ether, tetrahydrofuran, and the like; glycolethers such as ethylene glycolmonomethylether, ethylene glycolmonoethylether, ethylene glycoldimethylether (EDM), and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene and the like; ketones such as methylethylketone, cyclohexanone, 4-hydroxy-4-methyl pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like. Additionally, a high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may be also used.

Considering miscibility and reactivity, ketones such as cyclohexanone, and the like, glycol ethers such as ethylene glycol monoethylether, ethylene glycoldimethylether, ethylene glycoldiethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol methylether acetate, propylene glycol propylether acetate and the like may be preferably used.

The solvent is used in a balance amount, for example, 30 wt % to 60 wt %, for example, 35 wt % to 55 wt % based on a total amount of the photosensitive resin composition. When the solvent is included within the above range, the photosensitive resin composition may have an appropriate viscosity resulting in improvement of processability in manufacturing the color filter.

On the other hand, the photosensitive resin composition may further include an additive of malonic acid; 3-amino-1,2-propanediol; a silane-based coupling agent; a leveling agent; a fluorine-based surfactant; a radical polymerization initiator; or a combination thereof.

The silane-based coupling agent may have a reactive substituent of a vinyl group, a carboxyl group, a methacryloxy group, an isocyanate group, an epoxy group, and the like, in order to improve close-contacting properties with a substrate.

Examples of the silane-based coupling agent may include trimethoxysilylbenzoic acid, γ-methacryloxypropyltrimethoxysilane, vinyltriacetoxysilane, vinyltrimethoxysilane, γ-isocyanatepropyltriethoxysilane, γ-glycidoxypropyltrimethoxysilane, p-epoxycyclohexylethyltrimethoxysilane, and the like, and these may be used alone or in a mixture of two or more.

The silane-based coupling agent may be included in an amount of 0.01 parts by weight to 10 parts by weight based on 100 parts by weight of the photosensitive resin composition. When the silane-based coupling agent is included within the range, close-contacting properties, storage properties, and the like may be improved.

The photosensitive resin composition may further include a surfactant, for example, a fluorine-based surfactant in order to improve coating properties and prevent a defect if necessary.

Examples of the fluorine-based surfactant may be a commercial fluorine-based surfactant such as BM-1000®, and BM-1100® (BM Chemie Inc.); MEGAFACE F 142D®, F 172®, F 173®, F 183® and F 554° (Dainippon Ink Kagaku Kogyo Co., Ltd.); FULORAD FC-135®, FULORAD FC-170C®, FULORAD FC-430®, and FULORAD FC-431° (Sumitomo 3M Co., Ltd.); SURFLON S-112®, SURFLON S-113®, SURFLON S-131®, SURFLON S-141®, and SURFLON S-145® (Asahi Glass Co., Ltd.); and SH-28PA®, SH-190®, SH-193®, SZ-6032®, and SF-8428®, and the like (Toray Silicone Co., Ltd.).

The fluorine-based surfactant may be used in an amount of 0.001 to 5 parts by weight based on 100 parts by weight of the photosensitive resin composition. When the surfactant is included within the range, excellent wetting on an IZO substrate or a glass substrate as well as coating uniformity may be secured, a stain may not be produced.

Furthermore, the photosensitive resin composition may include other additives such as an antioxidant, a stabilizer, and the like in a predetermined amount unless they deteriorate properties of the photosensitive resin composition.

Another embodiment provides a photosensitive resin film manufactured by exposing, developing, and curing the aforementioned photosensitive resin composition.

A method of forming a pattern in the photosensitive resin film is as follows.

1 (1) Coating and Film Formation

The photosensitive resin composition is coated to have a desired thickness on a substrate such as a glass substrate or an IZO substrate which undergoes a predetermined pretreatment, using a spin or slit coating method, a roll coating method, a screen-printing method, an applicator method, and the like, is heated at 70° C. to 100° C. for 1 minute to 10 minutes through a VCD process to remove a solvent, forming a photosensitive resin film.

(2) Exposure

The photosensitive resin film is patterned by disposing a mask consisting of a half-tone part for realizing a black matrix pattern and a full-tone for realizing a column spacer pattern and then, radiating an actinic ray ranging from 200 nm to 500 nm. The radiation is performed by using a light source such as a mercury lamp with a low pressure, a high pressure, or an ultrahigh pressure, a metal halide lamp, an argon gas laser, and the like. And an X-ray, an electron beam, and the like may be also used depending on a case.

Exposure process uses, for example, a light dose of 500 $mJ/cm^2$ or less (with a 365 nm sensor) when a high-pressure mercury lamp is used even though the light dose may vary depending on types of each component, its combination ratio, and a dry film thickness.

(3) Development

After the exposure process, an alkali aqueous solution is used to develop the exposed film by dissolving and removing an unnecessary part except the exposed part, forming a pattern.

(4) Post-Treatment

The developed image pattern may be post-heated in order to accomplish excellent quality in terms of heat resistance, photo resistance, close contacting properties, crack-resistance, chemical resistance, high strength, storage stability, and the like.

Another embodiment provides a color filter including the photosensitive resin film.

Another embodiment provides a display device including the color filter.

The display device may be, for example, a liquid crystal display (LCD), a camera image sensor (CIS), or the like.

Hereinafter, the present invention is illustrated in more detail with reference to examples, but these examples, however, are not in any sense to be interpreted as limiting the scope of the invention.

Synthesis of Dye

Synthesis Example 1: Synthesis of Core-Shell Dye Mixture 1

[Reaction Scheme 1: Synthesis of Intermediate 1-a]

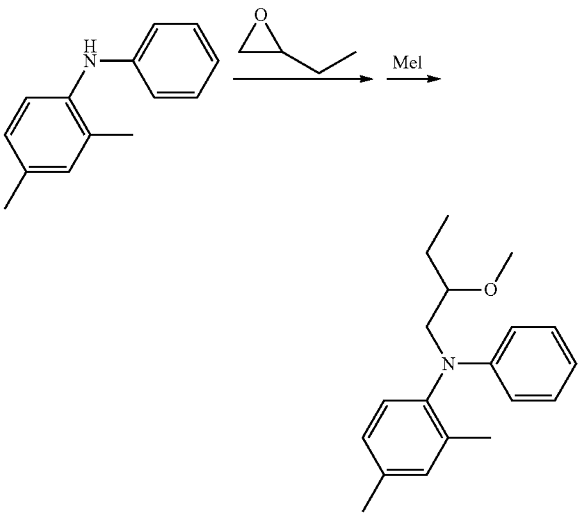

<Intermediate 1-a>

2,4-Dimethyldiphenylamine (10 mol), 1,2-butylene oxide (10 mol), and sodium hydride (10 mol) were added to N,N-dimethyl formamide (DMF) and then, heated at 90° C. and stirred for 24 hours. After lowering the temperature to room temperature, Iodomethane (10 mol) and sodium hydride (10 mol) were added thereto and then, stirred for 6 hours. Subsequently, ethyl acetate was added to this solution at room temperature and then, twice washed with water, extracting an organic layer. The extracted organic layer was distilled under a reduced pressure and separated through column chromatography, obtaining <Intermediate 1-a>.

[Reaction Scheme 3: Synthesis of Intermediate 1-b]

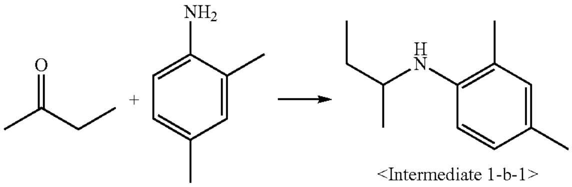

<Intermediate 1-b-1>

Sodium borohydride (12 mmol) was added to dichloroethane (50 ml), and 5 ml of acetic acid was added drop by drop thereto. Subsequently, 2-butanone (11 mmol) and 2,4-dimethylaniline (10 mmol) were added to this solution and then, stirred at room temperature for 1 hour. Then, DIW (De-Ionized Water) was added thereto to distill an organic layer under a reduced pressure and purify it through column chromatography, obtaining a compound expressed by <Intermediate 1-b-1>.

[Reaction Scheme 3: Synthesis of Intermediate 1-b]

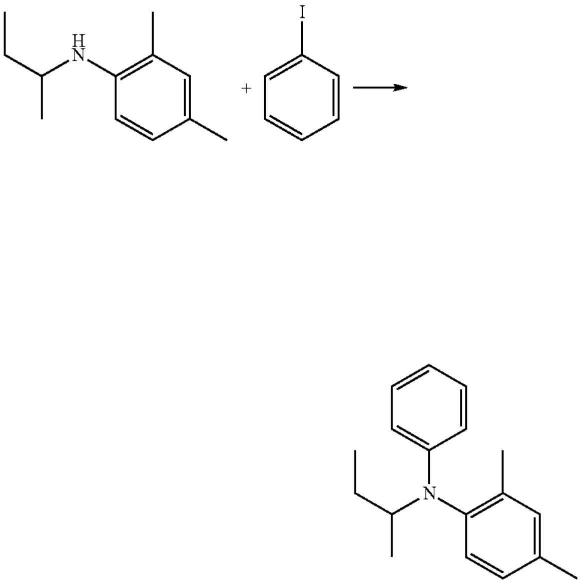

<Intermediate 1-b>

Intermediate 1-b-1 (10 mmol), Iodobenzene (11 mmol), sodium tert-butoxide (15 mmol), palladium(II) acetate (0.3 mmol), and a tri-tert-butylphosphine/toluene (5/5) solution (0.6 mmol) were added to toluene and then, stirred under reflux for 12 hours, and then, a reactant produced therefrom was distilled under a reduced pressure and purified through column chromatography, obtaining a compound expressed by <Intermediate 1-b>.

[Reaction Scheme 4]

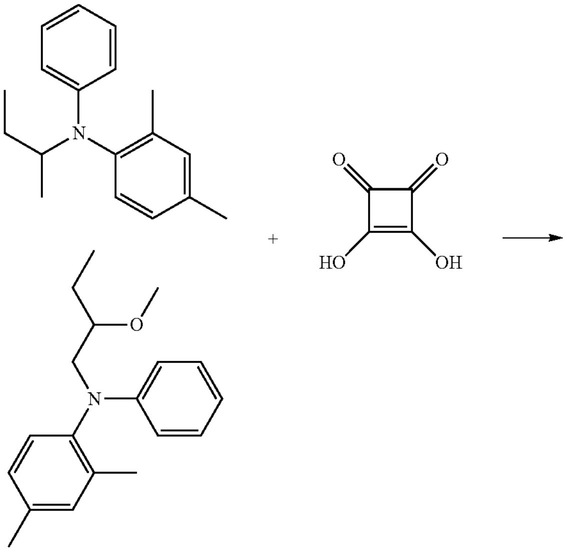

-continued

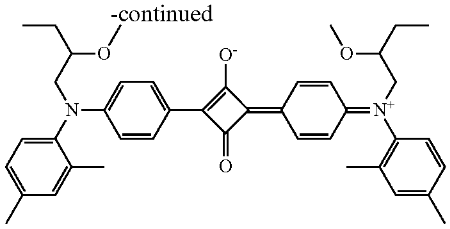

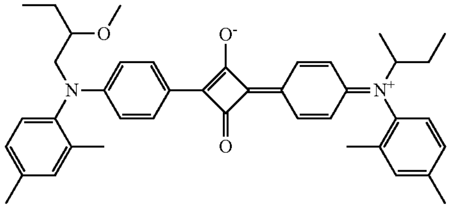

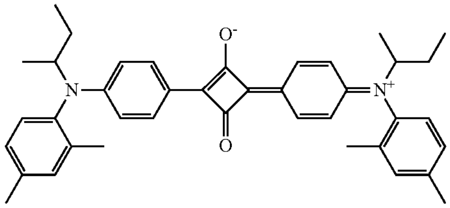

Intermediate 1-a (5 mmol), Intermediate 1-b (5 mmol), and 3,4-dihydroxy-3-cyclobutyne-1,2-dione (5 mmol) were added to toluene (25 mL) and butanol (25 mL) and then, refluxed, wherein a Dean-stark distillation device was used to remove water produced therefrom. After 4 hours' stirring, a green reactant therefrom was distilled under a reduced pressure and purified through column chromatography, preparing a mixture of Chemical Formulas 1-1, 1-2, and 1-3.

5 g of the mixture of the compounds represented by Chemical Formulas 1-1, 1-2, and 1-3 was dissolved in 500 mL of a chloroform solvent, and then, isophthaloyl chloride (5.5 g) and p-xylylenediamine (3.7 g) were respectively dissolved in 500 mL of chloroform and then, simultaneously added dropwise to the aforementioned chloroform solvent in which the mixture was dissolved at room temperature for 1 hour. Subsequently, 7.5 ml of triethylamine was added thereto at room temperature for 0.5 hour. After 30 minutes, the obtained mixture was distilled under a reduced pressure and separated through column chromatography, preparing a core-shell dye mixture of an (A-1) core (the compound represented by Chemical Formula 1-1)-shell (the compound represented by Chemical Formula 5-1) compound (Maldi-TOF MS: 1179), an (A-2) core (the compound represented by Chemical Formula 2-1)-shell (the compound represented by Chemical Formula 5-1) compound (Maldi-TOF MS: 1150), and an (A-3) core (the compound represented by Chemical Formula 3-1)-shell (the compound represented by Chemical Formula 5-1) compound (Maldi-TOF MS: 1120) mixed in a weight ratio of 1:2:1.

[Chemical Formula 1-1]

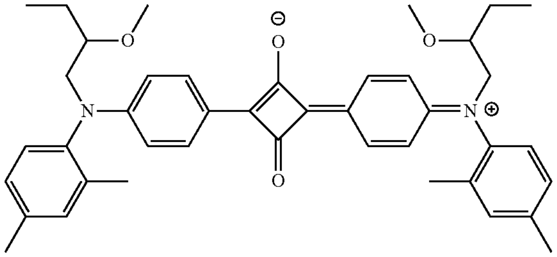

[Chemical Formula 2-1]

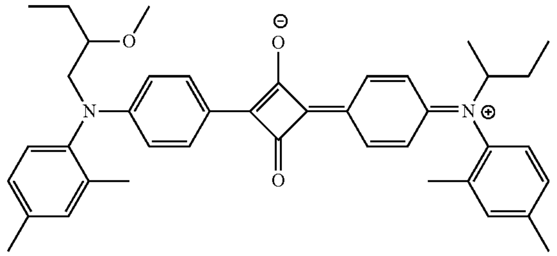

[Chemical Formula 3-1]

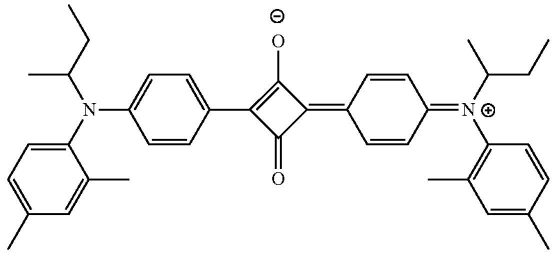

[Chemical Formula 5-1]

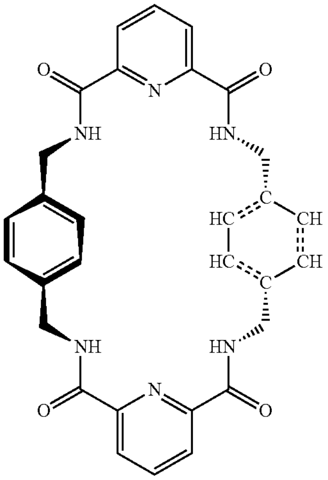

Synthesis Example 2: Synthesis of Core-shell Dye Mixture 2

A core-shell dye mixture of an (A-1) core (the compound represented by Chemical Formula 1-2)-shell (the compound represented by Chemical Formula 5-1) compound (Maldi-TOF MS: 1232), an (A-2) core (the compound represented by Chemical Formula 2-2)-shell (the compound represented by Chemical Formula 5-1) compound (Maldi-TOF MS: 1176), and an (A-3) core (the compound represented by Chemical Formula 3-1)-shell (the compound represented by Chemical Formula 5-1) compound (Maldi-TOF MS: 1120)

mixed in a weight ratio of 1:2:1 was prepared in the same manner as in Synthesis Example 1 except that 1,2-epoxy-cyclohexane was used instead of the 1,2-butylene oxide.

[Chemical Formula 1-2]

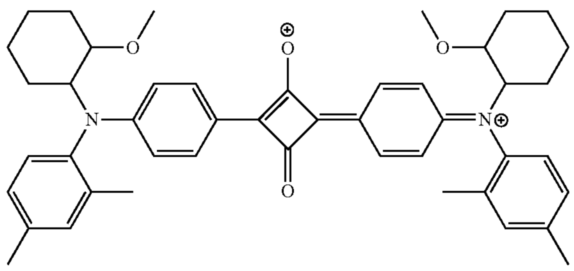

[Chemical Formula 2-2]

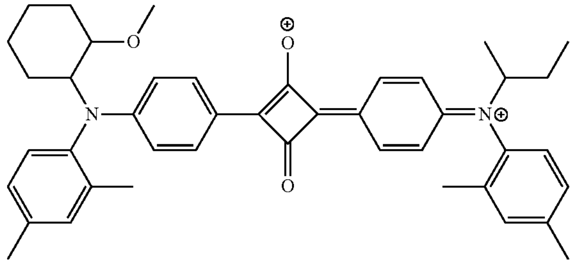

Synthesis Example 3: Synthesis of Core-Shell Dye Mixture 3

A core-shell dye mixture of an (A-1) core (the compound represented by Chemical Formula 1-2)-shell (the compound represented by Chemical Formula 5-1) compound (Maldi-TOF MS: 1232), an (A-2) core (the compound represented by Chemical Formula 2-3)-shell (the compound represented by Chemical Formula 5-1) compound (Maldi-TOF MS: 1206), and an (A-3) core (the compound represented by Chemical Formula 3-2)-shell (the compound represented by Chemical Formula 5-1) compound (Maldi-TOF MS: 1180) in a weight ratio of 1:2:1 was prepared in the same manner as in Synthesis Example 1 except that 1,2-epoxycyclo-hexane and 2,3-butylene oxide were used instead of the 1,2-butylene oxide in Reaction Scheme 1 of Synthesis Example 1.

[Chemical Formula 2-3]

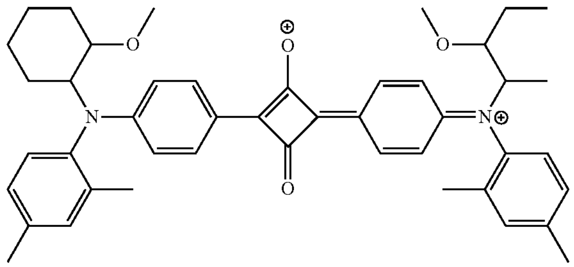

-continued

[Chemical Formula 3-2]

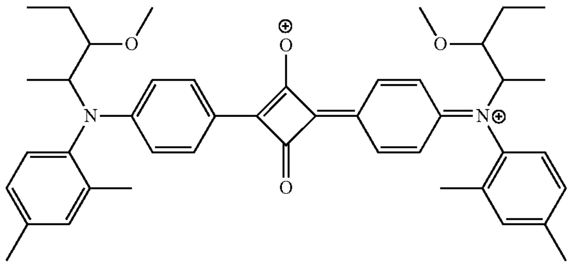

Synthesis Example 4: Synthesis of Core-Shell Dye Mixture 4

A core-shell dye mixture of an (A-1) core (the compound represented by Chemical Formula 1-2)-shell (the compound represented by Chemical Formula 5-1) compound (Maldi-TOF MS: 1232), an (A-2) core (the compound represented by Chemical Formula 2-7)-shell (the compound represented by Chemical Formula 5-1) compound (Maldi-TOF MS: 1206), and an (A-3) core (the compound represented by Chemical Formula 3-3)-shell (the compound represented by Chemical Formula 5-1) compound (Maldi-TOF MS: 1180) in a weight ratio of 1:2:1 was prepared in the same manner as in Synthesis Example 1 except that an intermediate using 1,2-epoxycyclohexane instead of the 1,2-butylene oxide in Reaction Scheme 1 of Synthesis Example 1 was used with Intermediate 1-a of Synthesis Example 1 without performing Reaction Schemes 2 and 3.

[Chemical Formula 2-7]

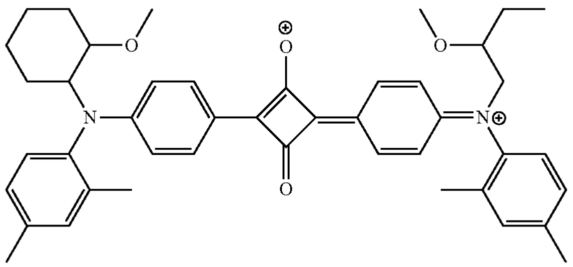

[Chemical Formula 3-3]

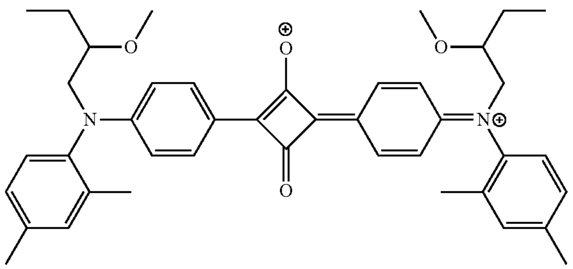

Synthesis Example 5: Synthesis of Core-Shell Dye Mixture 5

[Reaction Scheme 5: Synthesis of Intermediate C]

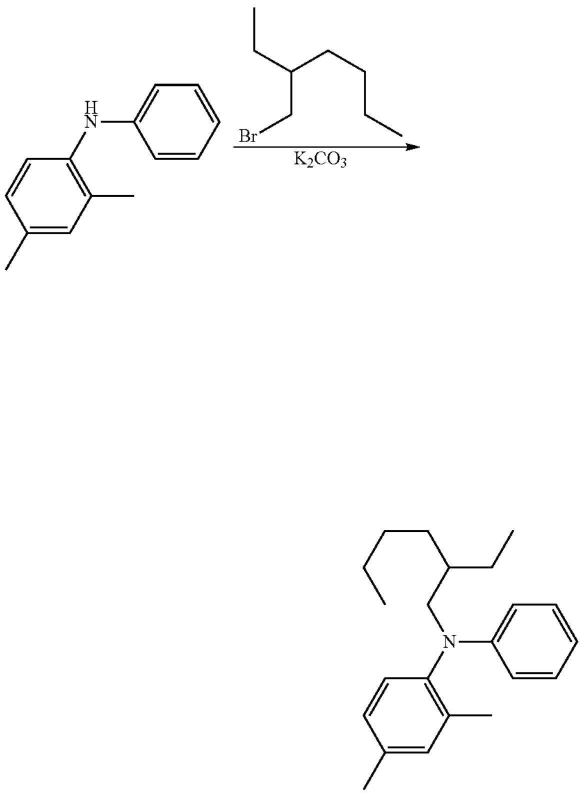

<Intermediate 1-b>

2,4-Dimethyldiphenylamine (10 mol), potassium carbonate (20 mol) were added to N,N-dimethyl formamide (DMF) and then, stirred. 1-Bromo-2-ethylhexane (20 mmol) was added thereto and then, heated at 90° C. and stirred for 24 hours. After lowering the temperature to room temperature, ethyl acetate was added to this solution and then, twice washed with water, extracting an organic layer. The extracted organic layer was distilled under a reduced pressure and separated through column chromatography, obtaining <Intermediate C>.

A core-shell dye mixture of an (A-1) core (the compound represented by Chemical Formula 1-3)-shell (the compound represented by Chemical Formula 5-1) compound (Maldi-TOF MS: 1180), an (A-2) core (the compound represented by Chemical Formula 2-7)-shell (the compound represented by Chemical Formula 5-1) compound (Maldi-TOF MS: 1206), and an (A-3) core (the compound represented by Chemical Formula 3-4)-shell (the compound represented by Chemical Formula 5-1) compound (Maldi-TOF MS: 1232) in a weight ratio of 1:2:1 was prepared in the same manner as in Synthesis Example 1, except that in Reaction Scheme 1 of Synthesis Example 1, 2,3-butylene oxide was used instead of the 1,2-butylene oxide, and in Reaction Scheme 2 of Synthesis Example 1, Intermediate C synthesized according to Reaction Scheme 5 was used instead of the 2-butanone.

[Chemical Formula 1-3]

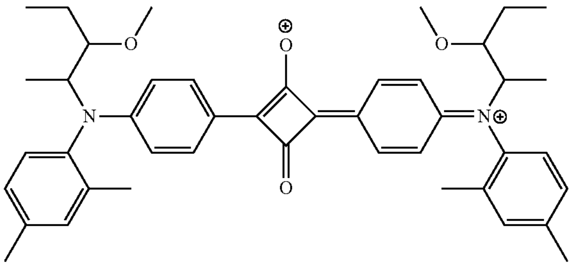

[Chemical Formula 2-4]

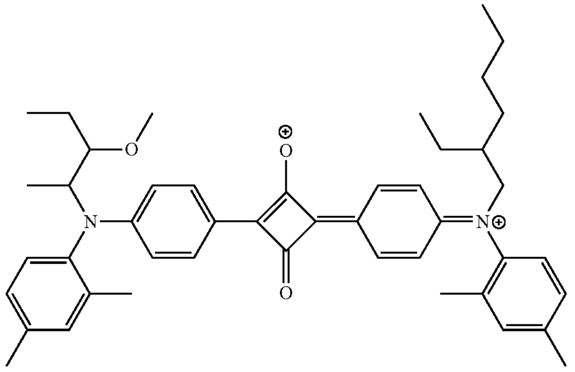

[Chemical Formula 3-4]

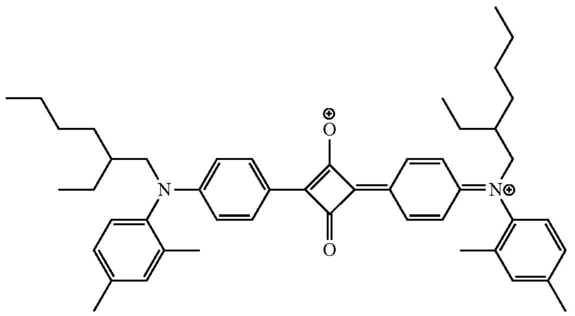

Synthesis Example 6: Synthesis of Core-Shell Dye Mixture 6

A core-shell dye mixture of an (A-1) core (the compound represented by Chemical Formula 1-1)-shell (the compound represented by Chemical Formula 5-1) compound (Maldi-TOF MS: 1180), an (A-2) core (the compound represented by Chemical Formula 2-5)-shell (the compound represented by Chemical Formula 5-1) compound (Maldi-TOF MS: 1206), and an (A-3) core (the compound represented by Chemical Formula 3-4)-shell (the compound represented by Chemical Formula 5-1) compound (Maldi-TOF MS: 1232) in a weight ratio of 1:2:1 was prepared in the same manner as in Synthesis Example 5, except that 1,2-butylene oxide was used instead of the 2,3-butylene oxide.

[Chemical Formula 2-5]

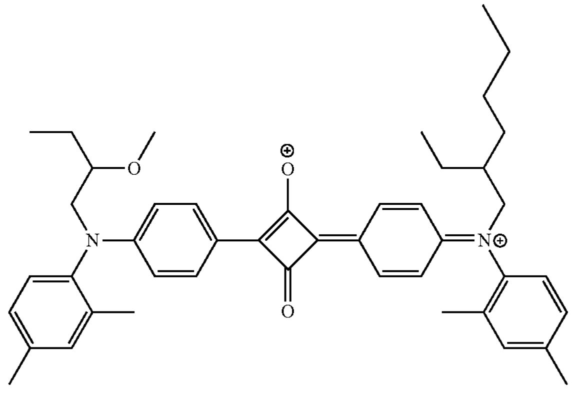

Synthesis Example 7: Synthesis of Core-Shell Dye Mixture 7

A core-shell dye mixture of an (A-1) core (the compound represented by Chemical Formula 1-2)-shell (the compound represented by Chemical Formula 5-1) compound (Maldi-TOF MS: 1231.4), an (A-2) core (the compound represented by Chemical Formula 2-6)-shell (the compound represented by Chemical Formula 5-1) compound (Maldi-TOF MS: 1231.5), and an (A-3) core (the compound represented by Chemical Formula 3-4)-shell (the compound represented by Chemical Formula 5-1) compound (Maldi-TOF MS: 1232) in a weight ratio of 1:2:1 was prepared in the same manner as in Synthesis Example 5, except that 1,2-epoxycyclohexane was used instead of the 2,3-butylene oxide.

[Chemical Formula 2-6]

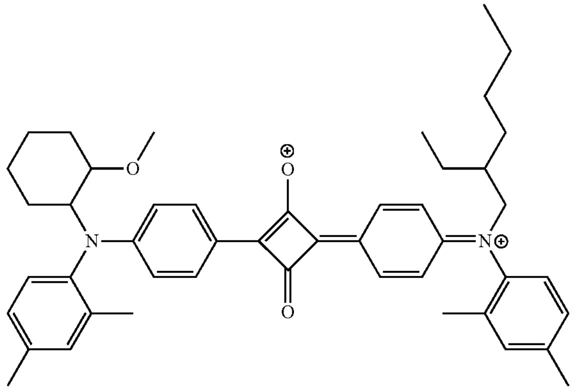

Comparative Synthesis Example 1: Synthesis of Core-shell Dye

A core (compound represented by Chemical Formula 3-4)-shell (compound represented by Chemical Formula 5-1) compound (Maldi-TOF MS: 1232) was prepared in the same manner as in Synthesis Example 5 except that Intermediate C alone was used instead of the intermediate using 2,3-butylene oxide.

Comparative Synthesis Example 2: Synthesis of Core-Shell Dye

A core (compound represented by Chemical Formula 1-2)-shell (compound represented by Chemical Formula 5-1) compound (Maldi-TOF MS: 1231.4) was prepared in the same manner as in Synthesis Example 7 except that Intermediate C was not used, but the intermediate using 1,2-epoxycyclohexane was used.

Comparative Synthesis Example 3: Synthesis of Core-Shell Dye Mixture

The core (compound represented by Chemical Formula 3-4)-shell (compound represented by Chemical Formula 5-1) compound (Maldi-TOF MS: 1232) of Comparative Synthesis Example 1 and the core (compound represented by Chemical Formula 1-2)-shell (compound represented by Chemical Formula 5-1) compound (Maldi-TOF MS: 1231.4) of Comparative Synthesis Example 2 were mixed in a weight ratio of 1:1, preparing a mixture.

Evaluation 1: Evaluation of Dye Precipitation 5 wt % of each compound according to Synthesis Examples 1 to 7 and Comparative Synthesis Examples 1 to 3 was added to a dilute solvent (PGMEA), and the corresponding solution was stirred at 100 rpm for 1 hour at 40° C. with a mixing rotor (MIXROTAR VMR-5, luchi Co., Ltd.) and then, examined with naked eyes to find out when precipitates of each compound were visually confirmed under the condition of 40° C., and the results are shown in Table 1.

TABLE 1

| | Time of precipitation after dissolving 5 wt % of PGMEA (40° C.) |
|---|---|
| Synthesis Example 1 | 2 weeks |
| Synthesis Example 2 | 2 weeks |
| Synthesis Example 3 | 2 weeks |
| Synthesis Example 4 | 2 weeks |
| Synthesis Example 5 | 2 weeks |
| Synthesis Example 6 | 2 weeks |
| Synthesis Example 7 | 2 weeks |
| Comparative Synthesis Example 1 | 1 week |
| Comparative Synthesis Example 2 | insoluble |
| Comparative Synthesis Example 3 | 1 day |

Referring to Table 1, the mixtures (dyes) according to Synthesis Examples 1 to 7 were significantly suppressed from precipitation after dissolution, compared with conventional squarylium-based monomolecular dyes or other mixtures.

EXAMPLES

Preparation of Photosensitive Resin Compositions

Examples 1 to 7 and Comparative Examples 1 to 3

According to the compositions shown in Table 2, a photopolymerization initiator was added to a solvent and then, dissolved by stirring at room temperature for one hour. Subsequently, a binder resin and a photopolymerizable monomer were added thereto and then, stirred for 1 hour at room temperature. Then, other additives were added thereto and then, stirred for 1 hour at room temperature. After adding a colorant thereto and then, stirring the mixture at room temperature for 2 hours, the solution was three times filtered to remove impurities, preparing photosensitive resin compositions according to Examples 1 to 7 and Comparative Examples 1 to 3. These photosensitive resin compositions were prepared by using the following components.

(A) Colorant (A-1) Dye according to Synthesis Example 1

(A-2) Dye according to Synthesis Example 2

(A-3) Dye according to Synthesis Example 3

(A-4) Dye according to Synthesis Example 4

(A-5) Dye according to Synthesis Example 5

(A-6) Dye according to Synthesis Example 6

(A-7) Dye according to Synthesis Example 7

(A-8) Dye according to Comparative Synthesis Example 1

(A-9) Dye according to Comparative Synthesis Example 2

(A-10) Dye according to Comparative Synthesis Example 3

(B) Binder Resin

Acryl-based binder resin (SP-RY16, Showadenko)

(C) Photopolymerizable Monomer

DPHA (Nippon KAYAKU)

(D) Photopolymerization Initiator

Oxime-based compound (IRGACURE OXE01, BASF)

(E) Solvent

Propylene glycolmonomethylethylacetate (PGMEA, Sigma-Aldrich Co., Ltd.)

(F) Other Additives

Fluorine-based surfactant (F-554, DIC Co., Ltd.)

TABLE 2

(unit: wt %)

| | | Ex. 1 | Ex. 2 | Ex. 3 | Ex. 4 | Ex. 5 | Ex. 6 | Ex. 7 | Comp. Ex. 1 | Comp. Ex. 2 | Comp. Ex. 3 |
|---|---|---|---|---|---|---|---|---|---|---|---|
| (A) colorant | (A-1) | 38.2 | — | — | — | — | — | — | — | — | — |
| | (A-2) | — | 38.2 | — | — | — | — | — | — | — | — |
| | (A-3) | — | — | 38.2 | — | — | — | — | — | — | — |
| | (A-4) | — | — | — | 38.2 | — | — | — | — | — | — |
| | (A-5) | — | — | — | — | 38.2 | — | — | — | — | — |
| | (A-6) | — | — | — | — | — | 38.2 | — | — | — | — |
| | (A-7) | — | — | — | — | — | — | 38.2 | — | — | — |
| | (A-8) | — | — | — | — | — | — | — | 38.2 | — | — |
| | (A-9) | — | — | — | — | — | — | — | — | 38.2 | — |
| | (A-10) | — | — | — | — | — | — | — | — | — | 38.2 |
| (B) binder resin | | 4.57 | 4.57 | 4.57 | 4.57 | 4.57 | 4.57 | 4.57 | 4.57 | 4.57 | 4.57 |
| (C) photo-polymerizable monomer | | 8.70 | 8.70 | 8.70 | 8.70 | 8.70 | 8.70 | 8.70 | 8.70 | 8.70 | 8.70 |
| (D) photo-polymerization initiator | | 0.6 | 0.6 | 0.6 | 0.6 | 0.6 | 0.6 | 0.6 | 0.6 | 0.6 | 0.6 |
| (E) solvent | | 47.91 | 47.91 | 47.91 | 47.91 | 47.91 | 47.91 | 47.91 | 47.91 | 47.91 | 47.91 |
| (F) other additives | | 0.02 | 0.02 | 0.02 | 0.02 | 0.02 | 0.02 | 0.02 | 0.02 | 0.02 | 0.02 |

Evaluation: Evaluation of Luminance of Compositions

The photosensitive resin compositions according to Examples 1 to 7 and Comparative Examples 1 to 3 were respectively taken by 15 ml, coated to be about 10 μm thick on a glass substrate with a spin coater (Opticoat MS-A150, Mikasa Co., Ltd.), prebaked (PRB) on a hot-plate at 100° C. for 3 minutes and subsequently, post-baked (POB) (180° C., 30 minutes), and then, measured with respect to luminance on a 447 nm BLU by using a CAS spectrometer. The results are shown in Table 3.

TABLE 3

(unit: %)

| | Luminance |
|---|---|
| Example 1 | 97 |
| Example 2 | 98 |
| Example 3 | 98 |
| Example 4 | 98 |
| Example 5 | 98 |
| Example 6 | 98 |
| Example 7 | 99 |
| Comparative Example 1 | 83 |
| Comparative Example 2 | 54 |
| Comparative Example 3 | 77 |

As shown in Table 3, the photosensitive resin compositions according to Examples 1 to 7 were maximally suppressed from precipitation of a squarylium-based dye, compared with the photosensitive resin compositions according to Comparative Examples 1 to 3, and thus turned out to have very excellent luminance.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

The invention claimed is:

1. A photosensitive resin composition comprising a dye containing a mixture of:

(A-1) a compound represented by Chemical Formula 1 and a shell surrounding it, (A-2) a compound represented by Chemical Formula 2 and a shell surrounding it, and (A-3) a compound represented by Chemical Formula 3 and a shell surrounding it:

[Chemical Formula 1]

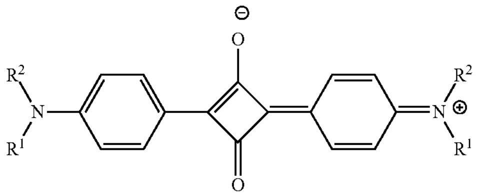

[Chemical Formula 2]

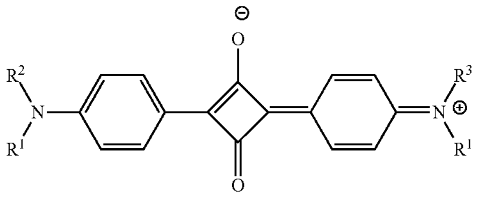

[Chemical Formula 3]

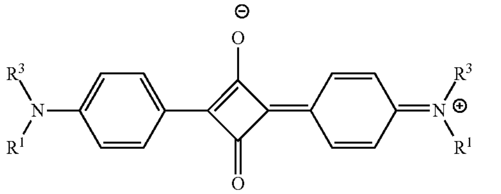

wherein, in Chemical Formula 1 to Chemical Formula 3, $R^1$ to $R^3$ are each a substituted or unsubstituted C1 to C20 alkyl group, a substituted or unsubstituted C3 to C20 cycloalkyl group, or a substituted or unsubstituted C6 to C20 aryl group, each $R^1$ is the same as each other $R^1$ and different from each $R^2$ and each $R^3$, each $R^2$ is the same as each other $R^2$ and different from each $R^1$ and each $R^3$, and each $R^3$ is the same as each other $R^3$ and different from each $R^1$ and each $R^2$.

2. The photosensitive resin composition of claim 1, wherein $R^1$ is a substituted or unsubstituted C6 to C20 aryl group, and $R^2$ and $R^3$ are each independently a substituted or unsubstituted C1 to C20 alkyl group or a substituted or unsubstituted C3 to C20 cycloalkyl group, provided that $R^2$ and $R^3$ are each different from each other.

3. The photosensitive resin composition of claim 1, wherein $R^1$ is a C6 to C20 aryl group substituted with a C1 to C10 alkyl group.

4. The photosensitive resin composition of claim 1, wherein $R^2$ and $R^3$ are each independently a C1 to C20 alkyl group substituted with a C1 to C10 alkyl group and/or a C1 to C10 alkoxy group, and $R^2$ and $R^3$ are each different from each other.

5. The photosensitive resin composition of claim 1, wherein in the mixture, the compound represented by Chemical Formula 1 and the compound represented by Chemical Formula 3 are each included in the same amount.

6. The photosensitive resin composition of claim 5, wherein in the mixture, the compound represented by Chemical Formula 2 is included in an amount greater than the compound represented by Chemical Formula 1.

7. The photosensitive resin composition of claim 5, wherein in the mixture, the compound represented by Chemical Formula 2 is included in an amount greater than the compound represented by Chemical Formula 3.

8. The photosensitive resin composition of claim 5, wherein the mixture includes the compound represented by Chemical Formula 1, the compound represented by Chemical Formula 2, and the compound represented by Chemical Formula 3 in a weight ratio of 1:2:1.

9. The photosensitive resin composition of claim 1, wherein the compound represented by Chemical Formula 1 is represented by any one of Chemical Formula 1-1 to Chemical Formula 1-3:

[Chemical Formula 1-1]

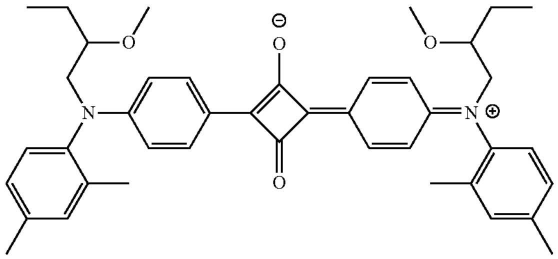

[Chemical Formula 1-2]

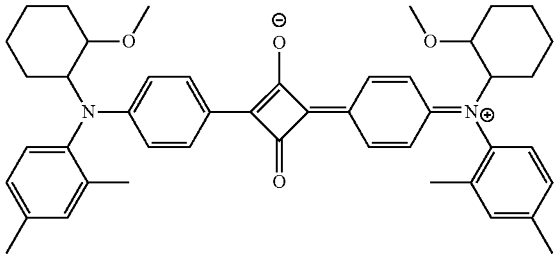

[Chemical Formula 1-3]

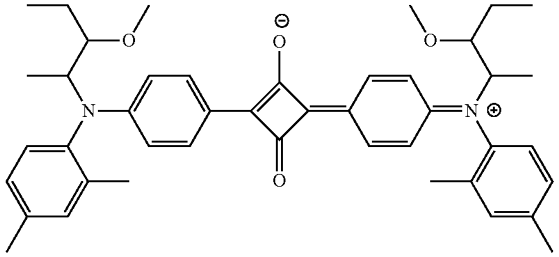

.

10. The photosensitive resin composition of claim 1, wherein the compound represented by Chemical Formula 2 is represented by any one of Chemical Formula 2-1 to Chemical Formula 2-7:

[Chemical Formula 2-1]

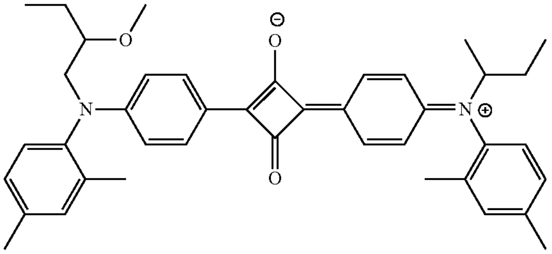

-continued
[Chemical Formula 2-2]
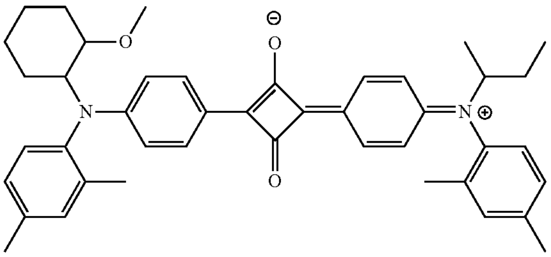
[Chemical Formula 2-3]
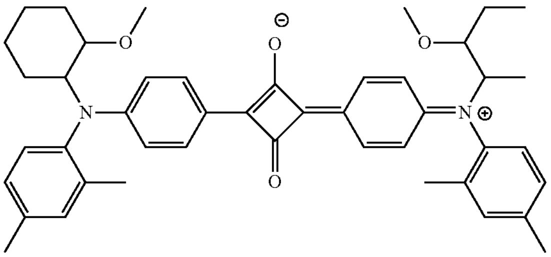
[Chemical Formula 2-4]
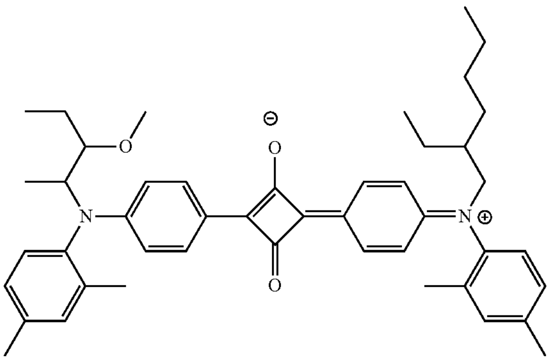
[Chemical Formula 2-5]
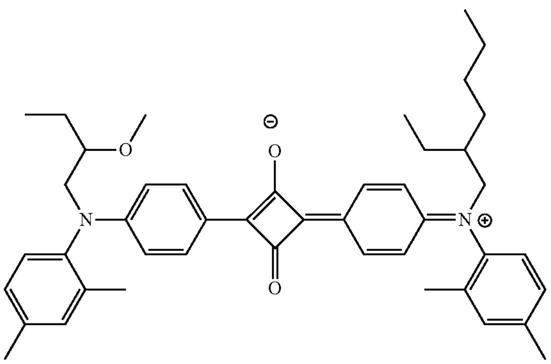
-continued
[Chemical Formula 2-6]
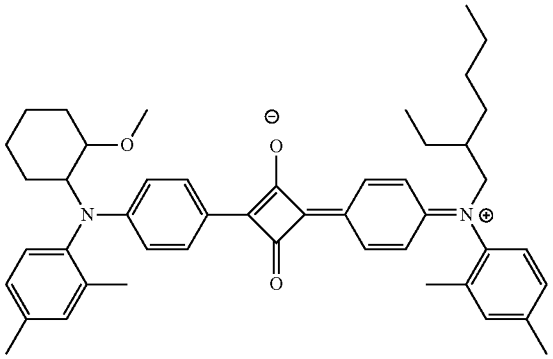
[Chemical Formula 2-7]
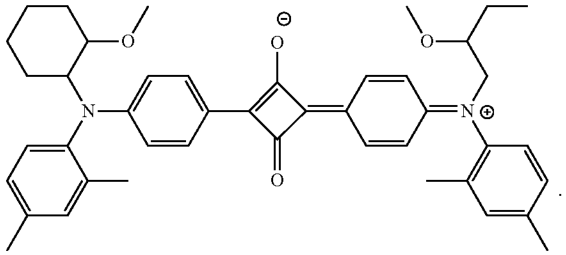
11. The photosensitive resin composition of claim 1, wherein the compound represented by Chemical Formula 3 is represented by any one of Chemical Formula 3-1 to Chemical Formula 3-4:
[Chemical Formula 3-1]
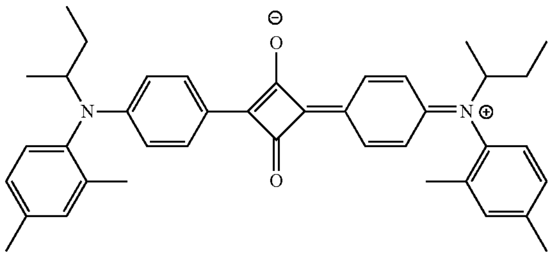
[Chemical Formula 3-2]
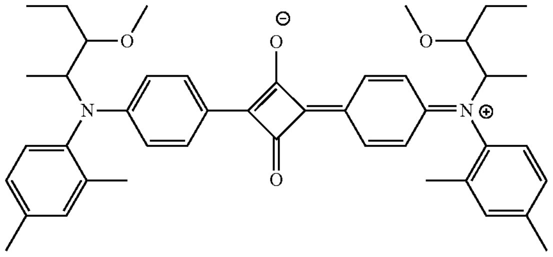

-continued

[Chemical Formula 3-3]

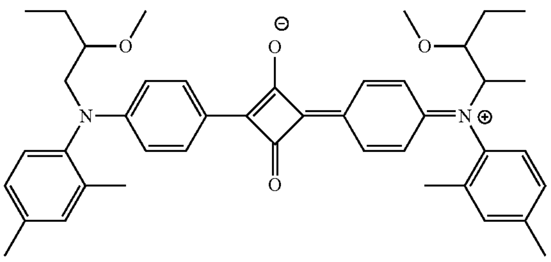

[Chemical Formula 3-4]

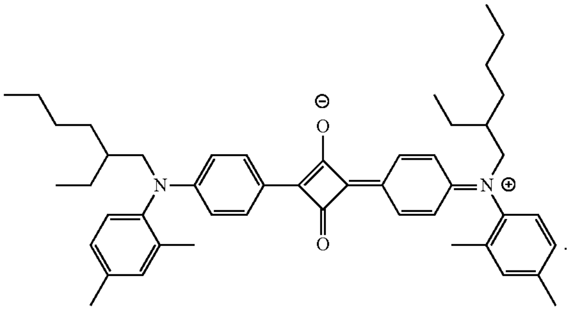

12. The photosensitive resin composition of claim 1, wherein the shell is represented by Chemical Formula 4 or Chemical Formula 5:

[Chemical Formula 4]

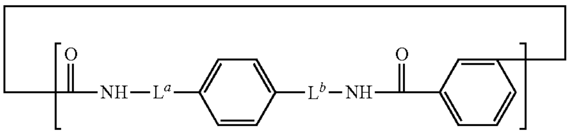

[Chemical Formula 5]

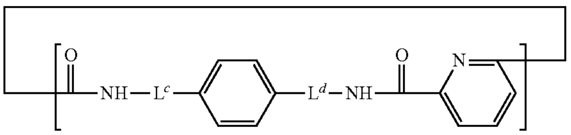

wherein, in Chemical Formula 4 and Chemical Formula 5, $L^a$ to $L^d$ are each independently a single bond or a substituted or unsubstituted C1 to C10 alkylene group.

13. The photosensitive resin composition of claim 12, wherein $L^a$ to $L^d$ are each independently a substituted or unsubstituted C1 to C10 alkylene group.

14. The photosensitive resin composition of claim 12, wherein the shell is represented by Chemical Formula 4-1 or Chemical Formula 5-1:

[Chemical Formula 4-1]

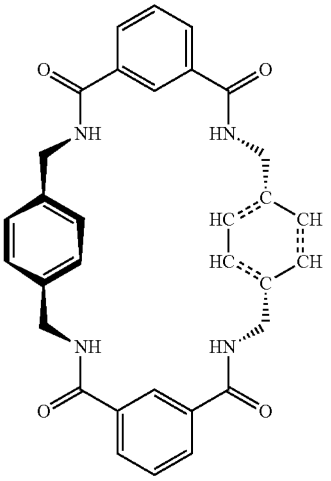

[Chemical Formula 5-1]

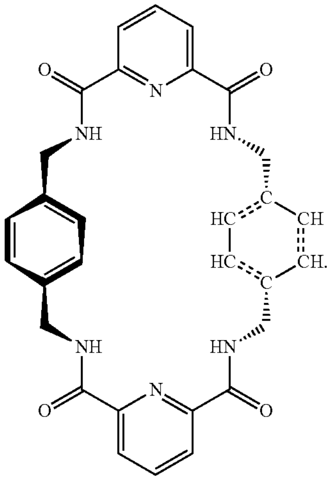

15. The photosensitive resin composition of claim 14, wherein the shell has a cage width of 6.5 Å to 7.5 Å.

16. The photosensitive resin composition of claim 1, wherein the compound represented by Chemical Formula 1, the compound represented by Chemical Formula 2, and the compound represented by Chemical Formula 3 each independently have a length of 1 nm to 3 nm.

17. The photosensitive resin composition of claim 1, wherein the photosensitive resin composition further includes a binder resin, a photopolymerizable monomer, a photopolymerization initiator, and a solvent.

18. The photosensitive resin composition of claim 17, wherein the photosensitive resin composition further includes malonic acid; 3-amino-1,2-propanediol; a silane-based coupling agent; a leveling agent; a fluorine-based surfactant; a radical polymerization initiator; or a combination thereof.

19. A photosensitive resin film manufactured by using the photosensitive resin composition of claim 1.

20. A color filter comprising the photosensitive resin film of claim 19.

21. A display device comprising the color filter of claim 20.

* * * * *